United States Patent [19]

Nishimura et al.

[11] Patent Number: 5,541,873
[45] Date of Patent: Jul. 30, 1996

[54] NONVOLATILE MEMORY

[75] Inventors: Kiyoshi Nishimura; Hideki Hayashi; Jun Muramoto; Takaaki Fuchikami; Hiromi Uenoyama, all of Kyoto, Japan

[73] Assignee: Rohm Co., Ltd., Japan

[21] Appl. No.: 490,816

[22] Filed: Jun. 15, 1995

[30] Foreign Application Priority Data

Jun. 16, 1994 [JP] Japan ..................... 6-134016
May 31, 1995 [JP] Japan ..................... 7-133759

[51] Int. Cl.⁶ ........................................ G11C 11/22
[52] U.S. Cl. .................. 365/145; 257/295; 365/149; 365/189.09
[58] Field of Search ................... 365/145, 149, 365/189.09; 257/295

[56] References Cited

U.S. PATENT DOCUMENTS

| | | | |
|---|---|---|---|
| 4,360,896 | 11/1982 | Brody | 365/145 |
| 4,873,664 | 10/1989 | Eaton, Jr. | 365/145 |
| 4,888,630 | 12/1989 | Patterson | 365/145 |
| 4,888,733 | 12/1989 | Mobley | 365/145 |

*Primary Examiner*—Joseph E. Clawson, Jr.
*Attorney, Agent, or Firm*—Merchant, Gould, Smith, Edell, Welter & Schmidt

[57] ABSTRACT

A nonvolatile memory having a simple structure where recorded information can be read nondestructively. A voltage is applied between a control gate and a memory gate for writing. A ferroelectric layer is polarized in accordance with the polarization of the applied voltage. A control gate voltage, necessary to form a channel, is small when the ferroelectric layer is polarized with the control gate side negative (polarized with second polarization). The control gate voltage $V_{cg}$ necessary to form a channel is large when the ferroelectric layer is polarized with the control gate side positive (polarized with first polarization). The reference voltage is applied to the control gate for reading. A large drain current flows when the ferroelectric layer is polarized with the second polarization and a small drain current flows when the ferroelectric layer is polarized with the first polarization. Recorded information can be read by detecting the drain current. The polzarization state of the ferroelectric layer is not affected by the reading operation.

17 Claims, 26 Drawing Sheets

Write operation mode

FIG. 7

| Standby mode | | Write mode | | Read mode | |
|---|---|---|---|---|---|
| L1~n="Low" | C1~n="Low" | L2="High" | C2="High" | L2="High" | C2="High" |
| CGL1:Vref | MGL1:Vref<br>MGL2:Vref<br>MGL3:Vref | CGL1:open | MGL1:Vref<br>MGL2:VDD/GND<br>MGL3:Vref | CGL1:open | MGL1:Vref<br>MGL2:open<br>MGL3:Vref |
| CGL2:Vref | MGL1:Vref<br>MGL2:Vref<br>MGL3:Vref | CGL2:Vref | MGL1:Vref<br>MGL2:VDD/GND<br>MGL3:Vref | CGL2:Vref | MGL1:Vref<br>MGL2:open<br>MGL3:Vref |
| CGL3:Vref | MGL1:Vref<br>MGL2:Vref<br>MGL3:Vref | CGL3:open | MGL1:Vref<br>MGL2:VDD/GND<br>MGL3:Vref | CGL3:open | MGL1:Vref<br>MGL2:open<br>MGL3:Vref |

Read mode annotations:
- $|I_D|=0$
- $|I_D|=\overline{I_{0max}/2}$
- $|I_D|=0$

Generating circuit for reference voltage

F I G. 9
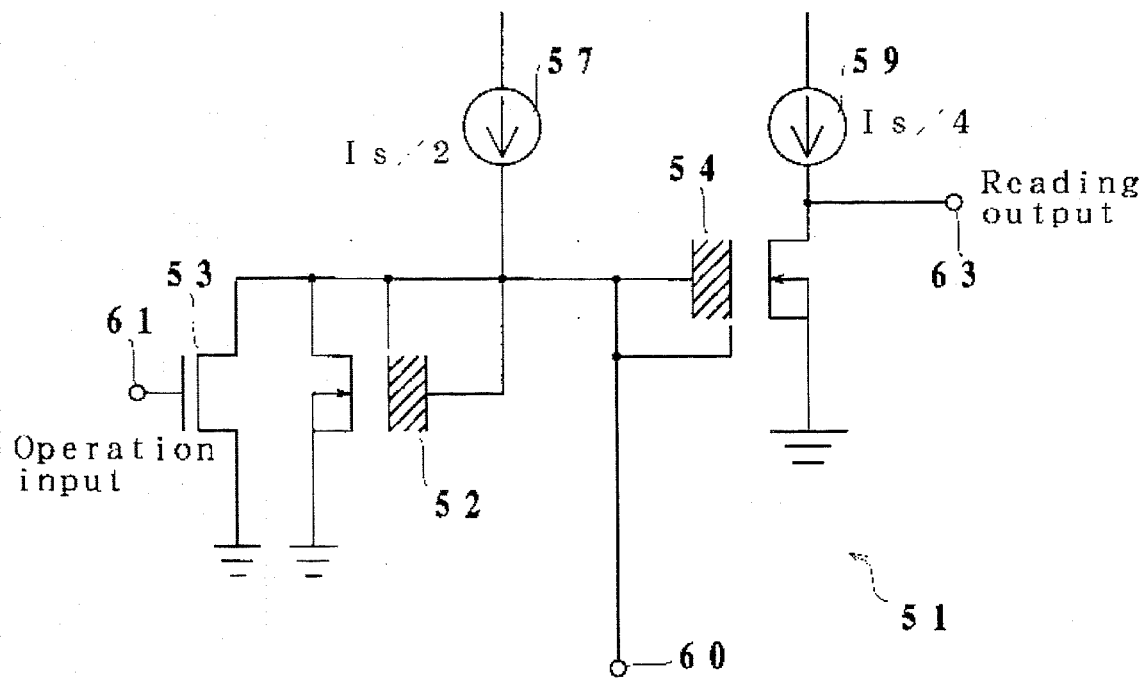
Judging circuit for drain current

Write operation mode

Read operation mode

Read operation mode

FIG. 17

|       | Write  | Read   | Standby |
|-------|--------|--------|---------|
| W/R   | H      | L      | —       |
| IN    | H or L | —      | —       |
| OUT   | —      | H or L | —       |
| C1    | L      | L      | L       |
| C2    | H      | H      | L       |
| L1    | L      | L      | L       |
| L2    | H      | H      | L       |

FIG. 18  Write operation mode

FIG. 19    Write operation mode

FIG. 20 Write operation mode

FIG. 22  Read operation mode

Read operation mode

FIG. 25 — Standby mode

FIG. 26  Standby mode

FIG. 27

|  | Write | Read | Standby |
|---|---|---|---|
| W/R | H | L | — |
| IN | H or L | — | — |
| OUT | — | H or L | — |
| $\overline{CE}$ | L | L | H |
| C₁ | L | L | — |
| C₂ | H | H | — |
| C₃ | L | L | — |
| ⋮ | ⋮ | ⋮ | ⋮ |
| R₁ | L | L | — |
| R₂ | H | H | — |
| R₃ | L | L | — |
| ⋮ | ⋮ | ⋮ | ⋮ |

NONVOLATILE MEMORY

BACKGROUND OF INVENTION

1. Field of the Invention

The present invention relates to nonvolatile memory.

2. Description of the Prior Art

Recently, a nonvolatile memory device using ferroelectric devices is getting attention in the industry, and several structures of the device and circuit configuration for the device are proposed. FIG. 1 shows a structure of a nonvolatile memory cell which is disclosed in U.S. Pat. No. 4,888,733 where a transistor 18 and a transistor 20 are connected to either side of a ferroelectric capacitor 2. Gates of the transistor 18 and the transistor 20 are connected to a word line 8. Also, a source of the transistor 18 is connected to a bit line 14, and a source of the transistor 20 is connected with a bit line 16.

The ferroelectric capacitor 2 is polarized when a certain voltage is applied between the bit line 14 and the bit line 16 after turning on the transistor 18 and the transistor 20. Polarization of the ferroelectric capacitor 2 is maintained even after the voltage is no longer applied. The direction of polarization can be inverted by applying a voltage in the opposite direction. Accordingly, the ferroelectric capacitor 2 is able to store data under nonvolatile conditions.

When reading out the stored data from the capacitor, a certain voltage is applied to the ferroelectric capacitor 2. Upon applying the voltage to the ferroelectric capacitor 2, memorized polarization can be read by detecting whether the polarization inverts or not. In other words, memorized polarization can be read by detecting a current flowing when the polarization inverts. Since the memorized polarization is changed (i.e. stored data is erased) when reading out the data from the ferroelectric capacitor 2, the same data as the stored data is written back into the ferroelectric capacitor immediately after reading, in order to maintain the original polarization direction.

Furthermore, another nonvolatile memory device utilizing ferroelectric capacitors consisting of 2 ferroelectric capacitors and 2 transistors is proposed (disclosed in U.S. Pat. No. 4,873,664).

However, the nonvolatile memory devices discussed hereinabove have the following issues to resolve.

First, the memory device disclosed in U.S. Pat. No. 4,888,733 requires 2 transistors besides the ferroelectric capacitor for each cell. Therefore, the structure of the device is complicated. Moreover, the memory device disclosed in U.S. Pat. No. 4,873,664 requires 2 transistors and 2 ferroelectric capacitors for each cell, so that construction of the device is even more complicated.

Further, since the stored data in the ferroelectric capacitor is erased when reading out the data as described above, the same data (as the stored data) must be re-written into the capacitor, so control of the read operation is complex.

SUMMARY OF THE INVENTION

It is an object of the present invention to provide a nonvolatile memory which can read out stored data under nondestructive conditions with a simple structure. A nonvolatile memory is formed by nonvolatile memory devices connected in a matrix in accordance with the present invention:

wherein the nonvolatile memory device comprises, a source region of a first conductive type and a drain region of the first conductive type, a channel region of a second conductive type formed between the source and the drain regions, a memory gate formed as a conducting layer on the channel region and insulated from the channel region a ferroelectric layer formed on the memory gate, and a control gate formed on the ferroelectric layer as a conducting layer, and wherein the nonvolatile memory comprises, a source-drain line which is formed by connecting the drain regions and the source regions of neighboring nonvolatile memory devices in a same column of the matrix and which connects the nonvolatile memory devices in the same column of the matrix in series, a control gate line which connects the control gates of the nonvolatile memory devices in the same column of the matrix, a memory gate line which connects the memory gates of the nonvolatile memory devices in a same row of the matrix.

A nonvolatile memory formed by nonvolatile memory devices connected in matrix in accordance with the present invention:

wherein the nonvolatile memory device comprises, a source region of a first conductive type and a drain region of the first conductive type, a channel region of a second conductive type formed between the source and the drain regions, a memory gate formed as a conductive layer on the channel region and insulated from the channel region, a ferroelectric layer formed on the memory gate, and a control gate formed on the ferroelectric layer as a conductive layer, and wherein the nonvolatile memory comprises, a source-drain line which is formed by connecting the drain regions and the source regions of neighboring nonvolatile memory devices in a same column of the matrix and which connects the nonvolatile memory devices in the same column of the matrix in series, a control gate line which connects the control gates of the nonvolatile memory devices in the same column of the matrix, a memory gate line which connects the memory gates of the nonvolatile memory devices in the same column of the matrix.

While the novel features of the invention are set forth in a general fashion, both as to organization and content, will be better understood and appreciated, along with other objections and features thereof, from the following detailed description taken in conjunction with the drawings.

BRIEF DESCRIPTION OF THE DRAWINGS

FIG. 7 is a table showing the applied voltages in the circuitry of FIG. 2 for each operational mode.

FIG. 9 shows a judgment circuit for a drain current.

FIG. 17 is a table showing the voltages applied to the circuitry of FIGS. 11–16 for each operational mode.

FIG. 27 is a table showing the voltages applied to the circuitry of FIGS. 18–26 for each operational mode.

DESCRIPTION OF TEE PREFERRED EMBODIMENTS

Figure 3:
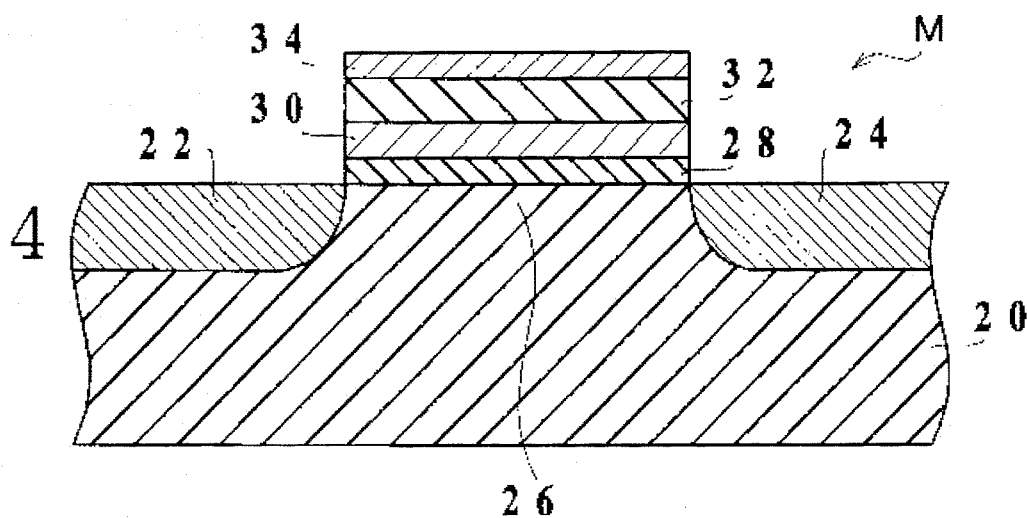
FIG. 3 shows structure of the nonvolatile memory device M used in the nonvolatile memory of FIG. 2.

Referring to FIG. 3, nonvolatile memory device M used in preferred embodiments is described. FIG. 3 shows the structure of an nonvolatile memory device M as an embodiment in the present invention. In the device M, a source region 22 and a drain region 24 are formed in a silicon substrate 20. An insulation layer 28 made of silicon oxide (SiO2) or silicon nitride (SiN) etc., is formed on a channel region 26 in the silicon substrate 20. A lower conducting layer (memory gate) 30 made of platinum of the like is formed on the insulation layer 28. A ferroelectric layer 32 made of $PbZr_xTi_{1-x}O_3$ (PZT) or the like, is formed on the lower conducting layer 30 and an upper conducting layer (control gate) 34 made of platinum or the like is formed on the ferroelectric layer 32. The lower conducting layer 30 or the upper conducting layer 34 may be oxidized conducting material such as RuOx, IrOx, ITO or metal material such as Pb, Au, Ag, Al, and Ni, instead of the platinum as described above.

Figure 4:
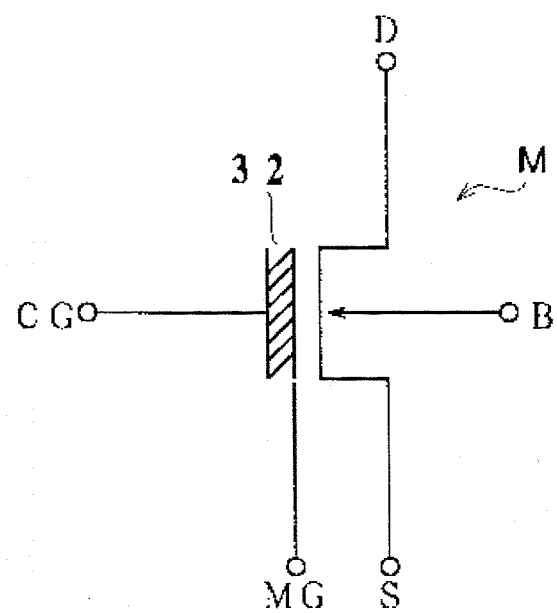
FIG. 4 shows a symbolic representation of the nonvolatile memory device M of FIG. 3.

FIG. 4 shows a symbol which represents the nonvolatile memory device M shown in FIG. 3. A control gate electrode CG is connected to the upper conducting layer 34 and a memory gate MG is connected to the lower conducting layer 30. Also, a source electrode S is connected to the source region 22 and a drain electrode D is connected to the drain region 24.

A certain voltage is applied between the control electrode CG and the memory gate MG when data is stored into the nonvolatile memory device M. Consequently, the ferroelectric 32 of the memory device M is polarized and the polarization is maintained even though application of the voltage is suspended. It is possible to obtain two opposite polarization states according to the polarity of the applied voltage. For example, when a voltage which is low compared to a voltage applied to the control gate CG, is applied to the memory gate electrode, the ferroelectric layer 32 is polarized as the control gate side is negative polarity (defined as the second polarization state). On the contrary, when a voltage which is high compared with a voltage applied to the control gate CG, is applied to the memory gate electrode, the ferroelectric layer 32 is polarized as the control gate side is positive polarity (defined as the first polarization state). Thus, two states can be memorized with a nonvolatile condition in the memory device M having the ferroelectric layer 32. In other words, information (data) corresponding to the two states can be memorized in the memory device M.

When the ferroelectric layer 32 is polarized as the control gate side is negative polarity (second polarization state), the voltage applied to control gate CG necessary to form a channel in the channel region is low. On the other hand, when the ferroelectric layer 32 is polarized as the control gate side is positive polarity (first polarization state), the voltage applied to control gate CG necessary to form a channel in the channel region is high. Therefore, it is possible to read out the stored information (data) by detecting whether the channel is formed or not in the channel region 26 by means of applying an intermediate voltage between the necessary voltage of control gate in the first polarization state and that in the second polarization state.

Figure 5A:
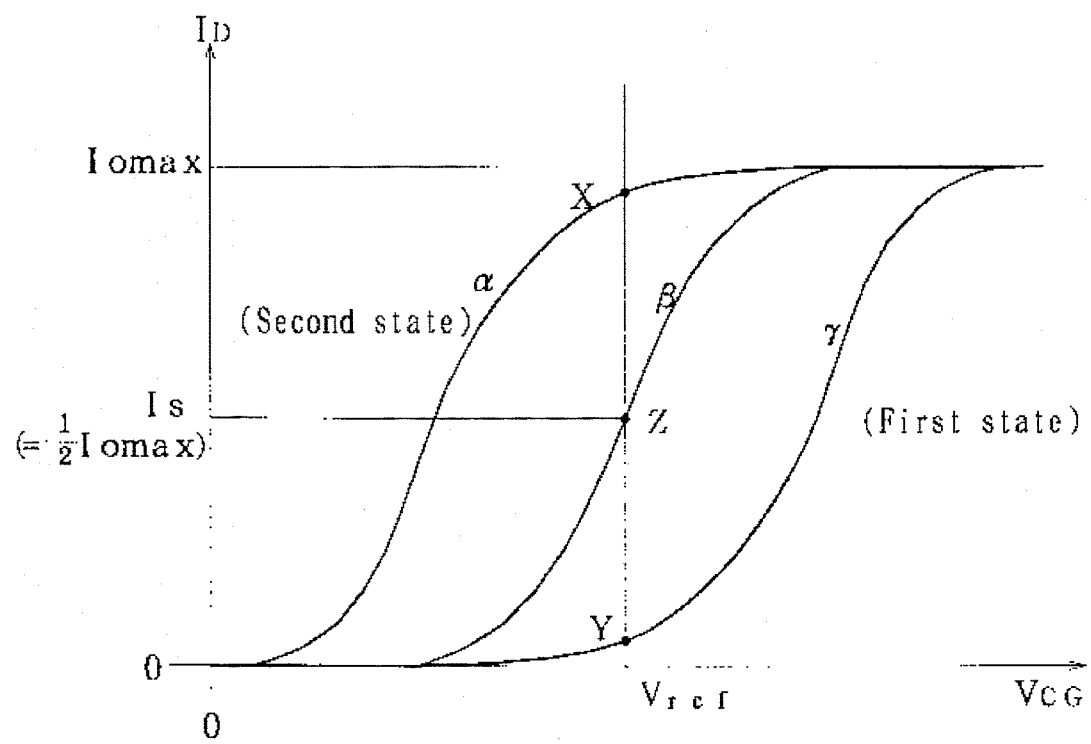
FIG. 5A shows an electric characteristic of the nonvolatile memory device M.
Figure 5B:
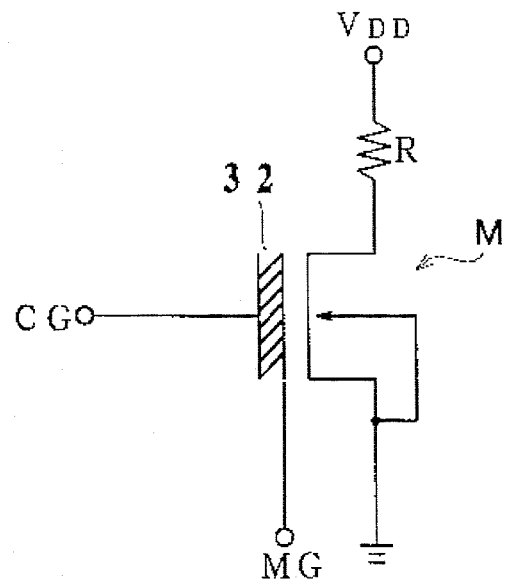
FIG. 5B shows a test circuit in which the electric characteristic of the nonvolatile memory is measured.

The relationship between the first and the second polarization states will be explained with reference to FIG. 5A which shows the electrical characteristics of the memory device M measured by a circuit shown in FIG. 5B. In FIG. 5A, a curve β shows the characteristic behavior for the control gate voltage $V_{CG}$ and the drain current $I_D$ when the control gate electrode CG and the memory gate electrode MG are electrically connected (short-circuited). The drain current $I_D$ increases when the control gate voltage $V_{CG}$ increases. When the control gate voltage $V_{CG}$ further increases, the drain current $I_D$ reaches a maximum drain current $I_{OMAX}$ determined by value of a resistance R.

Curve α shows the electrical characteristics where the ferroelectric is polarized as the control gate CG is the negative polarity (under the second state). Although the curve α shows a similar characteristic to the curve β, the drain current starts to flow at a low control gate voltage $V_{CG}$ due to the influence of the polarization of the ferroelectric layer 32. Also, the drain current reaches the established maximum drain current $I_{OMAX}$ at a low control voltage $V_{CG}$.

Curve α shows the electrical characteristics where the ferroelectric is polarized as the control gate CG is the positive polarity (under the first state). The curve α shows similar characteristics to the curve β, but the drain current starts to flow at a higher control gate voltage $V_{CG}$ due to the influence of the polarization of the ferroelectric layer 32. Also, the drain current reaches the established maximum drain current $I_{OMAX}$ at a high control voltage $V_{CG}$.

When reading out from the device M, a control gate voltage corresponding to a drain current (hereinafter referred to as reference current) Is, which is half the value of the established maximum drain current $I_{OMAX}$, is applied to the control gate CG as a reference voltage $V_{ref}$. The stored information can be known by judging whether the drain current $I_D$ is higher (see point X in FIG. 5A) than the reference current Is or not (see point Y in FIG. 5A).

Figure 1:
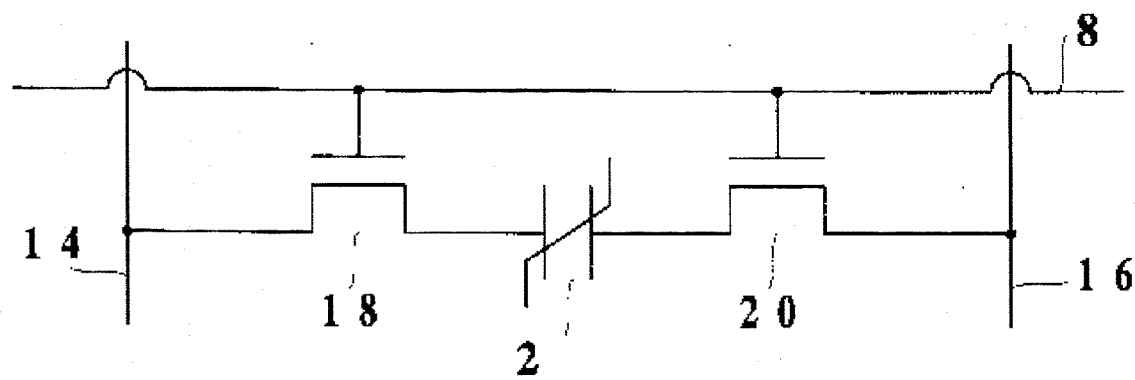
FIG. 1 shows circuitry of nonvolatile memory in a prior art.
Figure 2:
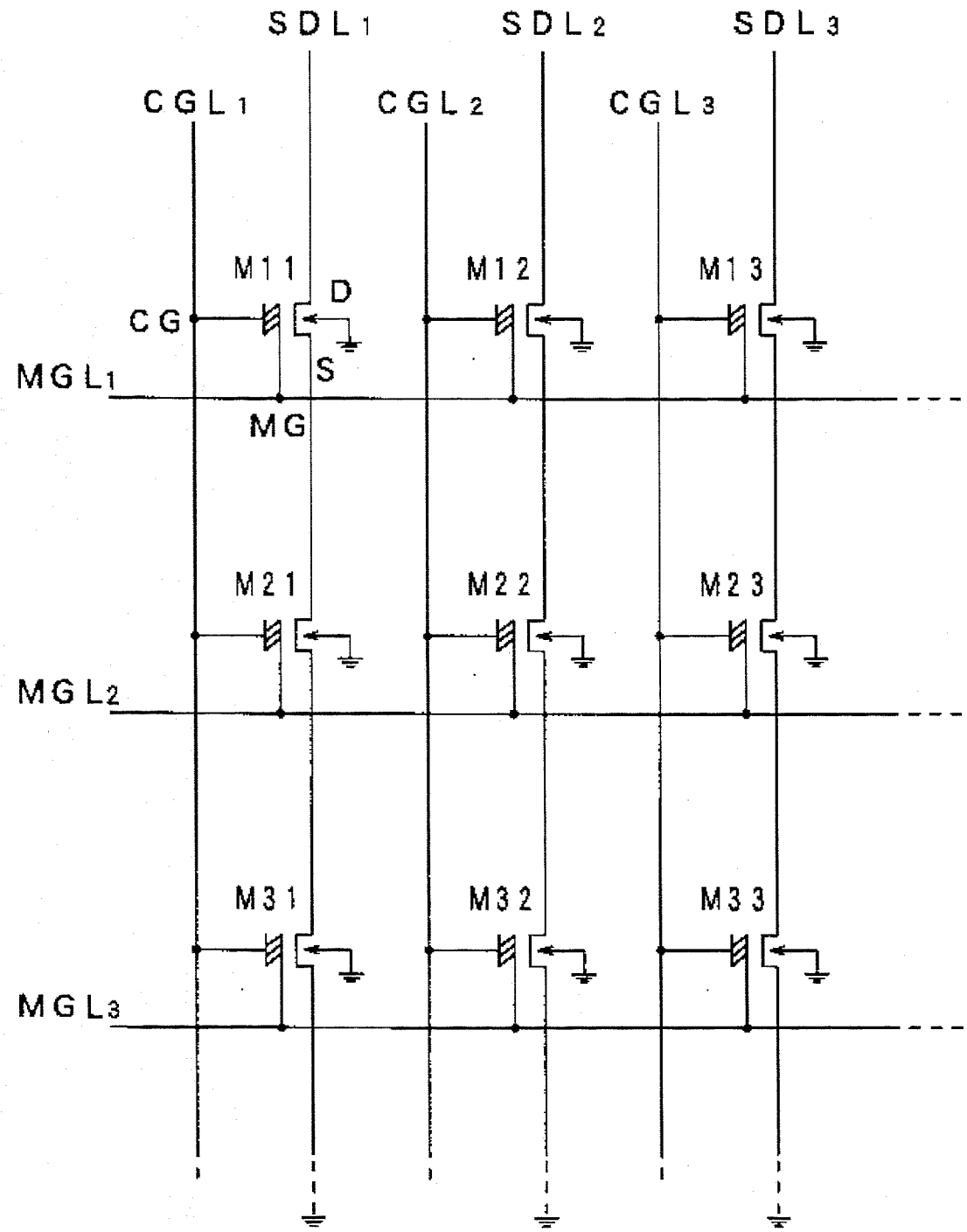
FIG. 2 shows circuitry of nonvolatile memory in an embodiment of the present invention.

FIG. 2 shows nonvolatile memory in which the nonvolatile memory devices of FIG. 4 are connected in a matrix.

Each memory gate electrode MG of memory devices (for example, $M_{11}$, $M_{12}$, $M_{13}$ ... ) of the same row in each column is connected to a memory gate line $MGL_1$, $MGL_2$, $MGL_3$ ..., respectively. Each control gate electrode CG of memory devices (for example, $M_{12}$, $M_{21}$, $M_{31}$ ... ) of the same column in each row is connected to a control gate line $CGL_1$, $CGL_2$, $CGL_3$ ..., respectively. Further, a source electrode S and a drain electrode D of the neighboring memory devices (for example, $M_{11}$ and $M_{21}$) in the same column are connected to each other, so that each memory device is connected in series. In other words, memory devices on the same row in each column are connected with a source-drain line in series, thereby constructing a NAND connected construction. Each end of the source-drain lines is grounded respectively. Thus, constructing the NAND connected construction, it is able to reduce the number of connecting points in a cell in comparison with the NOR connected construction.

Figure 6:
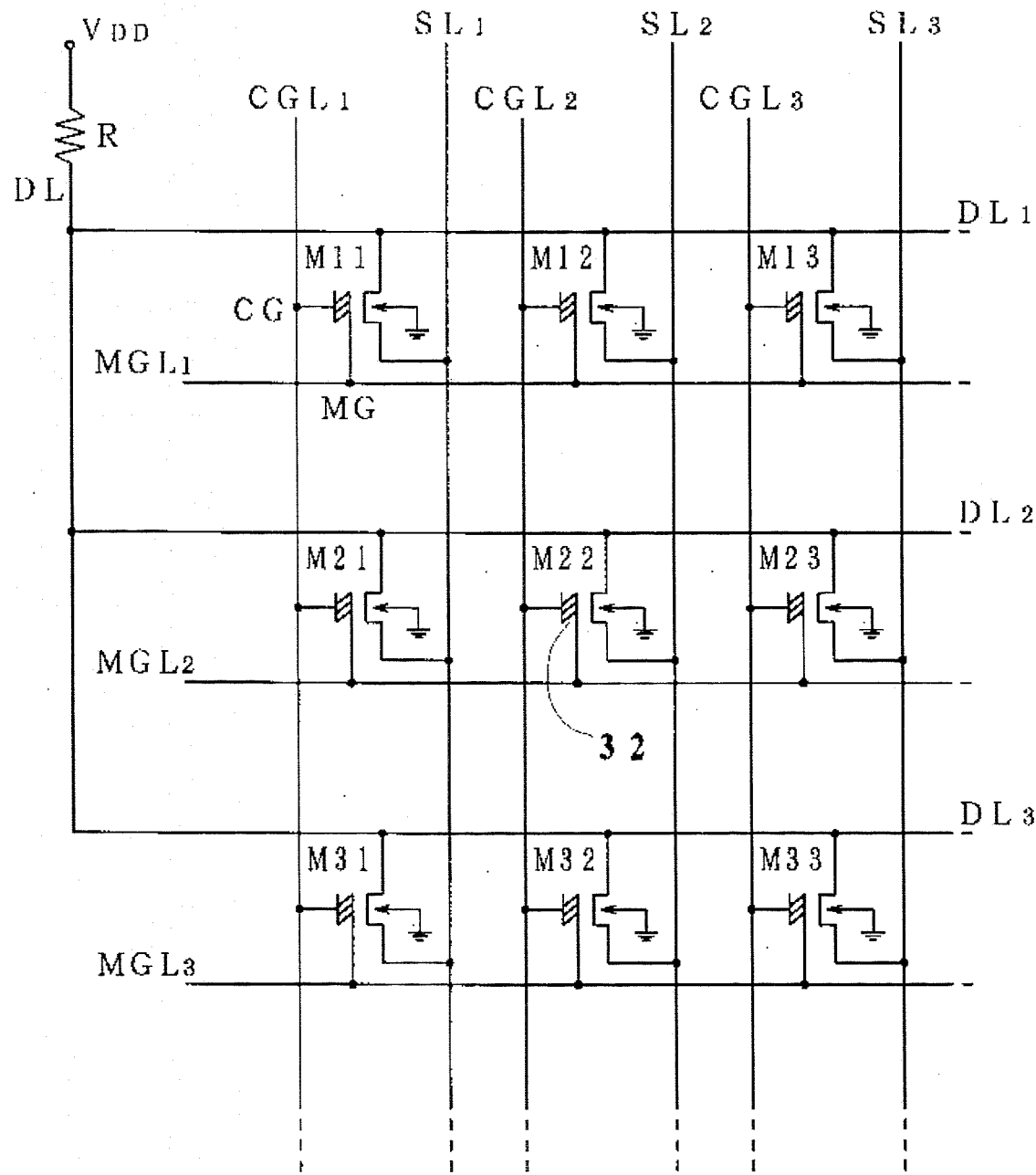
FIG. 6 shows circuitry of nonvolatile memory in the case of NOR-connection.

FIG. 6 shows a nonvolatile memory which as a NOR connected construction. In the case of the NOR connected construction, a connecting point for a source region and a source line and a connecting point for a drain region and a drain line are needed for each nonvolatile memory device. In comparison with the NOR connected construction, no connecting point described above is needed in case of the NAND connected construction shown in FIG. 2 so that the construction of connections can be simplified.

FIG. 7 shows the voltage applied to each line in the write, read and standby operational modes, as is described hereinbelow where memory device $M_{22}$ is selected in the memory.

In the write operation mode the reference voltage, $V_{ref}$, is applied to the control gate line $CGL_2$, which is connected to the selected memory device $M_{22}$, and the other control gate lines $CGL_1$, $CGL_3$ ... float. The writing voltage (5 V or ground), corresponding to information to be recorded is applied to the memory gate line $MGL_2$, and the reference voltage, $V_{ref}$, is applied to the other memory gate lines $MGL_1$, $MGL_3$ ... Thus, a writing voltage is applied to only the ferroelectric layer 32 of the selected memory device $M_{22}$ and the ferroelectric layer 32 is polarized. In other words, the ferroelectric layer 32 of the selected memory device $M_{22}$ is polarized into the first state or the second state in accordance with the writing voltage.

In the read operation mode the reference voltage, $V_{ref}$, is applied to the control gate line $CGL_2$, which is connected to the selected memory device $M_{22}$, and the other control gate lines $CGL_1$, $CGL_3$ ... float. The memory gate line $MGL_2$ floats and the reference voltage, $V_{ref}$, is applied to the other control gate line $MGL_1$, $MGL_3$ ....

Therefore, except for the selected memory device $M_{22}$ itself, the reference voltage $V_{ref}$ is applied both to the control gate and the memory gate of the memory device $M_{12}$, $M_{32}$ ... lying in the same column as the selected memory device $M_{22}$. Thus, these memory devices $M_{12}$, $M_{32}$ ... operate at a point shown by point Z in FIG. 5, so each channel is formed which carries a drain current with a value of about $I_S$ (half the value of the current Iomax. On the other hand, in the selected memory device $M_{22}$, the memory gate floats and the reference voltage $V_{ref}$ is applied to the control gate. Thus the selected memory device becomes ON (point X of FIG. 5) or OFF (point Y of FIG. 5) in accordance with the state recorded in the selected memory device $M_{22}$ (in accordance with polarization direction of the memory device $M_{22}$).

Therefore, when the selected memory device $M_{22}$ is in the ON state (second recorded state), a drain current of Is (=Iomax/2) flows through the source-drain line SDL2. When the selected memory device $M_{22}$ is in the OFF state (first recorded state), a drain current scarcely flows through the source-drain line SDL2.

By judging whether the drain current is larger or smaller than about a half value of the reference current $I_S$ (approximately Is/2), the recorded information can be read. In the read operation described above, the recorded information (the direction of polarization) can be maintained and is not destroyed during the read process.

As described above, write and read operations can be carried out on the desired memory device.

In above mentioned embodiment, the voltage (reference voltage $V_{ref}$) applied to the memory gate MG for writing is the same value as the voltage (reference voltage $V_{ref}$) applied to the memory gate MG for reading. Therefore, the voltage generation circuit becomes simplified. In another embodiment, the voltage applied for writing may be a different value from the voltage applied for reading, but should be intermediate the voltage corresponding to a current value between the established maximum drain current and zero.

A generation circuit for the reference voltage $V_{ref}$ is necessary to operate the memory circuit of FIG. 2. A suitable reference voltage $V_{ref}$ corresponding to the characteristic of the memory device is necessary to prevent erroneous operation. In this embodiment, a generation circuit 41 for reference voltage as shown in FIG. 8 is used for obtaining a suitable reference voltage $V_{ref}$.

Figure 8:
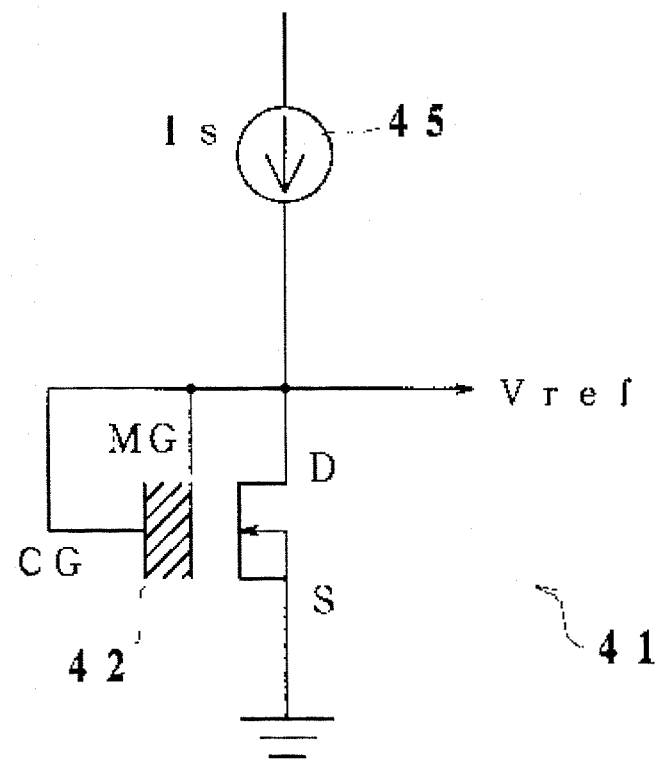
FIG. 8 shows a generation circuit for a reference voltage.

In FIG. 8, a device 42 for generating the reference voltage is the same device as the memory M which requires the reference voltage. The device 42 is made from the same wafer, in the same process and at the same time as the memory device M.

In the reference voltage generating circuit 41, the control gate electrode CG, the memory gate electrode MG and the drain electrode D of the device for generating reference voltage 42 are connected, and a constant current supply 45 for supplying the suppressed reference current Is (see FIG. 5) is connected to the drain D. The electric characteristics of the device 42 can be described as the curve β in FIG. 5, since the control gate electrode CG and the memory gate electrode MG of the device 42 are short-circuited. Also, since the current, Is, is supplied to the drain D of the device 42, the voltage at the control gate electrode CG is the reference voltage, $V_{ref}$. When the electric characteristics of the memory device M shift during the process of production or operation, the electric characteristics of the device 42 follow the characteristics of memory device M. Thus the reference voltage, $V_{ref}$, can be maintained at an appropriate value for the electric characteristics of the memory device M.

When an intermediate voltage is required instead of $V_{ref}$, a current source which supplies current corresponding to the intermediate voltage is used.

To operate the circuit shown in FIG. 2, a circuit for detecting drain current is required. In the explanation of FIG. 2 described above, stored data of the memory device $M_{22}$ (hereinafter referred to as a selected device) is detected by judging whether the drain current flowing in the source-drain line $SLD_2$ is higher or lower than approximately Is/2. The power supply voltage $V_{DD}$ is applied to the source-drain line $SDL_2$ through the resistor R so that the drain current $I_D$ is lower than approximately Is/2 when the selected device is polarized under the first state, and the drain current $I_D$ is higher than approximately Is/2 when the selected device is polarized under the second state. It is possible to carry out the detection by measuring the current flowing in the source-drain lines $SDL_2$. However, this causes complications in the circuit.

To simplify the circuit and to carry out accurate detection, a judgment circuit 51 for the drain current shown in FIG. 9 may be used. The first device 52 for current judgment and the second device 54 for current judgment are made from the same wafer, in the same process and at the same time as the memory device M. A constant-current source 57 supplies a current Is/2 that is quarter a value of the established maximum drain current $I_{OMAX}$ and is connected to the drain electrode D of the device 52. Also, a constant-current source 59 supplies a current Is/4 that is a quarter a value of the current Is, and is connected to the drain electrode D of the device 54. A terminal 60 of the circuit 51 is connected to the source drain line $SDL_2$ to be detected.

When the selected memory device $M_{22}$ is polarized under the second polarization state and the source-drain line $SDL_2$ can carry a current higher than Is/2, close to about Is, the current Is/2 of the constant-current source 57 flows to the memory device $M_{22}$ and does not flow into the device 52. Thus, both the device 52 and the device 54 are turned to the off state. On the other hand, when the selected memory device $M_{22}$ is polarized under the first polarization state and the source-drain line $SDL_2$ does not have the capability of carrying a drain current higher than Is/4, more than quarter a value of current $I_S$ of the current Is/2 of the constant-current source 57 does not flow to the memory device $M_{22}$. In other words, more thank quarter a value of current $I_S$ from the constant current source 57 flows into the device 52. Thus, both the device 52 and the device 54 can be turned to the on state. Therefore, an output corresponding to data stored in the selected memory device $M_{22}$ can be obtained from the read-out output terminal 63. Since both the device 57 and the device 59 are made from the same wafer, in the same process and at the same time as the memory device M, the probability of error is reduced.

When an input at an operating input terminal 61 is "L", the judgment circuit 5 is operated as described above because of the transistor 53 is turned off. However, when the input at the operating input terminal 61 is "H" the read-out output terminal 63 is fixed to the "L" state. This is because the transistor 53 is turned on by the input and current from the constant-current source 57 flows through the transistor 53.

Figure 10:
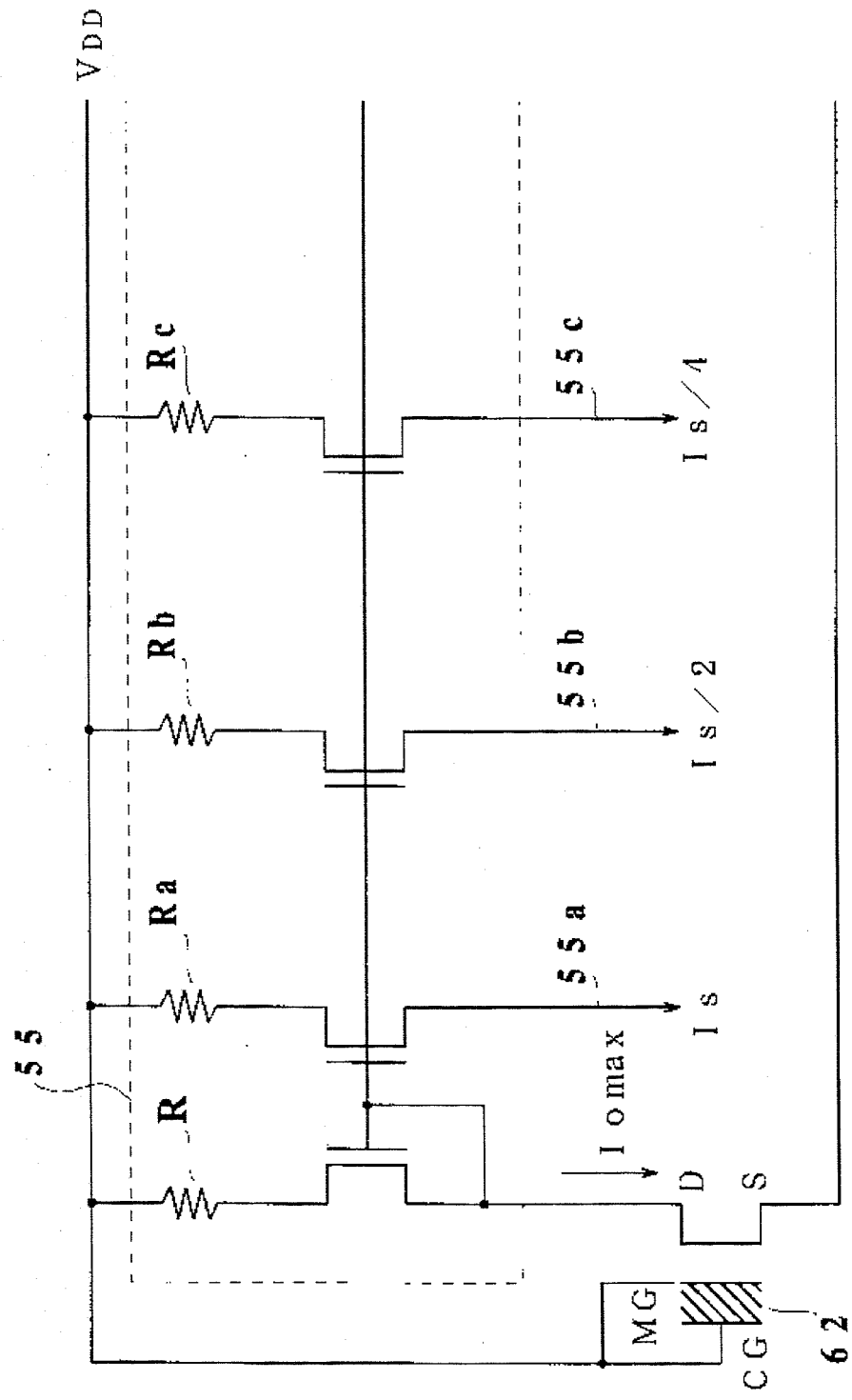
FIG. 10 shows a current source circuit.
Figure 11:
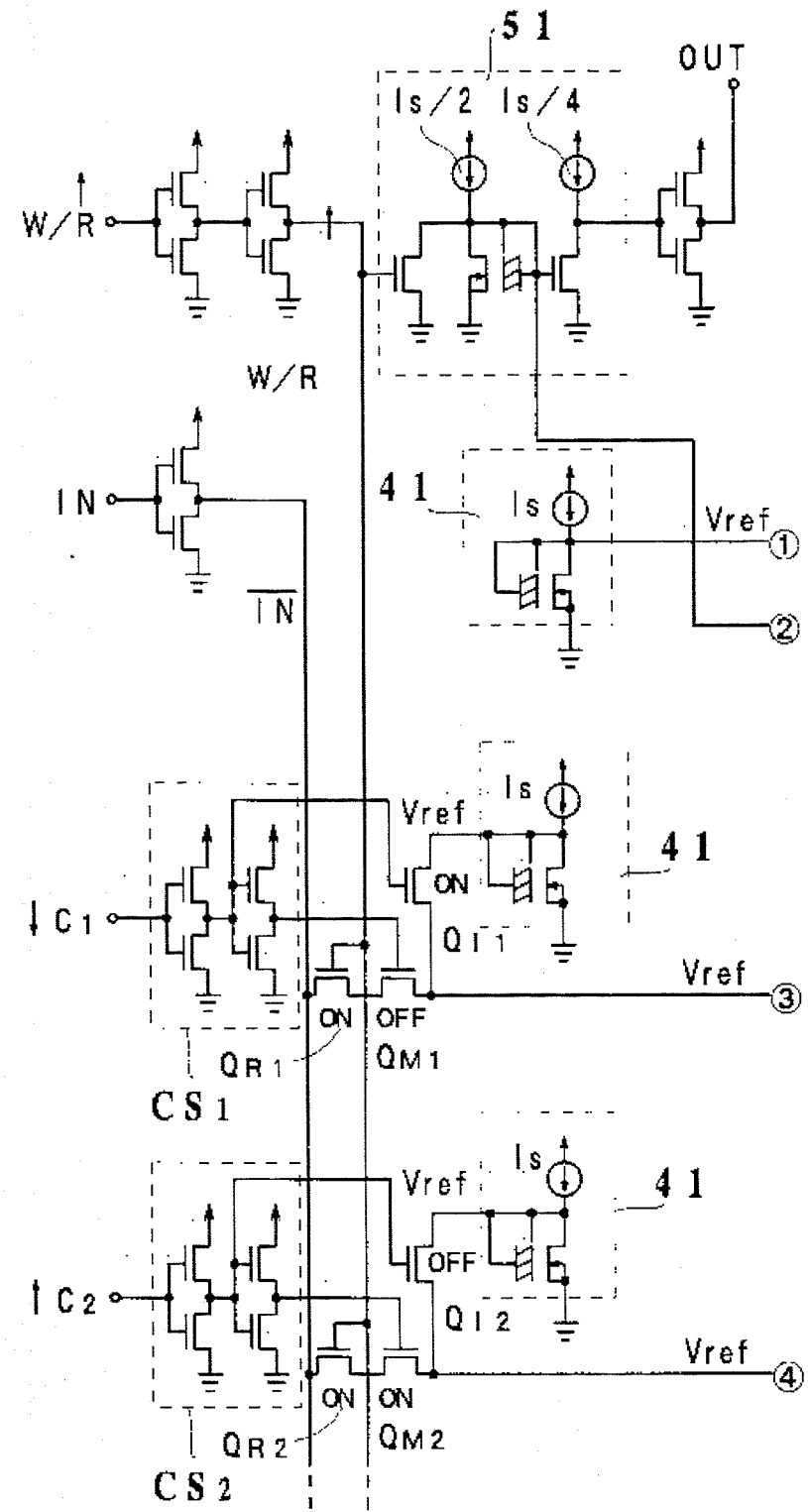
FIGS. 11 and 12 show the voltages applied to the nonvolatile memory in the write mode of the present invention.
Figure 12:
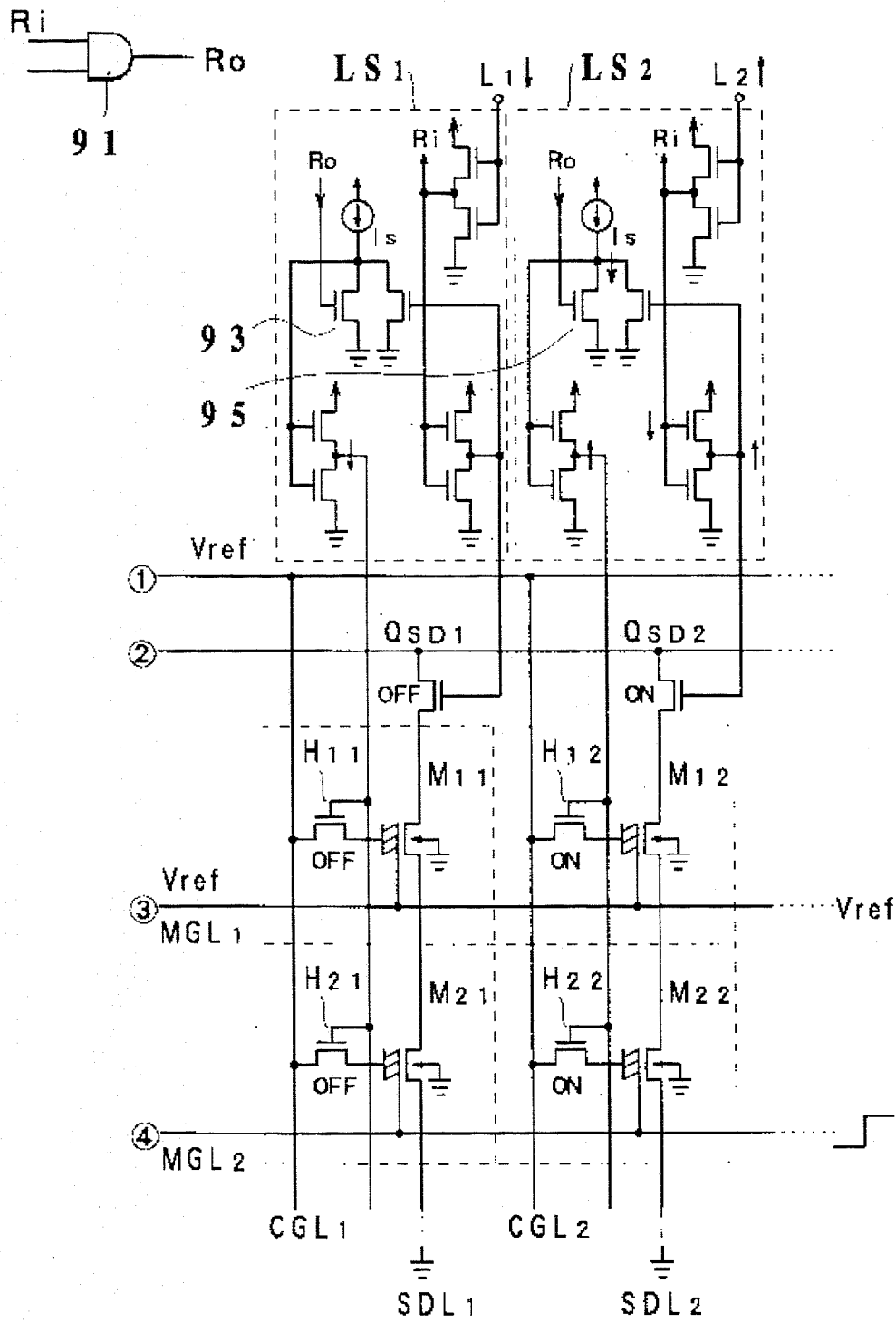

The constant-current source shown in FIG. 8 and FIG. 9 can be realized under a circuit shown in FIG. 10. In the circuit, a device 62 for generating current is made on the same wafer, in the same process and at the same time as the memory device M. The memory gate electrode MG and the control gate electrode CG of the device 62 are connected and the power supply $V_{DD}$ is applied to them. Also, an input side of a current mirror circuit 55 is connected to the drain electrode D of the device 62. Thus, the established maximum drain current $I_{OMAX}$, which corresponds to the shape and capability of the device, flows to the drain D of the device 62. Additionally, a resistor Ra is connected to an output side 55a of the current mirror circuit 55. By selecting a value of resistor Ra, it is possible to obtain the reference current Is (as half a value of the $I_{OMAX}$).

In the same manner as above, a resistor Rb to obtain a current having half a value of the current Is (as quarter a value of the $I_{OMAX}$) is connected to an output side 55b. Further, a resistor $R_c$, for producing a current having a quarter the value of the current Is (as a value of one-eighth of $I_{omax}$) is connected to an output side 55c.

Although a desired output current is obtained by selecting the value of the resistor in the embodiment described above, it is possible to obtain the desired output current by adjusting the width of the transistor (transistor width) of the output side. Consequently, it is possible to obtain the current by selecting both factors.

The device 62, made on the same wafer, in the same process and at the same time as the memory device M, is used to obtain the established maximum drain current $I_{OMAX}$ which is the basis for generating various outputs currents. Thus changes in electric characteristics can be canceled, avoiding errors.

FIGS. 11 to 16 show a memory matrix circuit using the generating circuit 41 for the reference voltage and the judgment circuit 51 for the drain current. Although FIGS. 11 to 16 only show a matrix of 2 rows and 2 columns for clarity, a matrix having n lines and n columns may be used.

In this embodiment, $C_1$ and $C_2$ are terminals for row selecting input and $CS_1$ and $CS_2$ are row selecting means (first selecting means). $L_1$ and $L_2$ are terminals for column selecting input and $LS_1$ and $LS_2$ are column selecting means (second selecting means). Transistor $Q_{SD1}$ and $Q_{SD2}$ (drain switching means) are controlled by the column selecting means $LS_1$ and $LS_2$.

The voltages applied to each terminal in the write mode is shown in FIG. 17. The operation of writing to the selected memory device $M_{22}$ will be described below. In the write operation a high level voltage (referred as "H") is applied to a terminal W/R, a low level voltage (referred as "L") or high level voltage to be recorded is applied to a terminal IN, "L" is applied to a terminal $C_1$, "H" is applied to a terminal $C_2$, "L" is applied to a terminal $L_1$ and "H" is applied to a terminal $L_2$.

Because the terminal W/R is "H", the input terminal 61 of the judgment circuit 51 is maintained with "H" and the judgment circuit 51 does not operate (the output terminal 63 is held to "L"). In this embodiment, "L" is zero Volts and "H" is 5 Volts. In this embodiment, memory gate switching means is constituted by transistors $Q_{11}$, $Q_{R1}$ and $Q_{M1}$ ($Q_{I2}$, $Q_{R2}$ and $Q_{M2}$).

In this embodiment, between each control gate of the memory device ($M_{11}$ and $M_{21}$) in the same column of the matrix and the control gate line $CGL_1$, control gate protecting transistor $H_{11}$ and $H_{21}$ are provided as control gate protecting switching means respectively. In the same way, between each control gate of the memory devices ($M_{12}$ and $M_{22}$) in the same column of the matrix and the control gate line $CGL_2$, control gate protecting transistors $H_{12}$ and $H_{22}$ are provided as control gate protecting switching means, respectively.

"H" is applied only to the terminal $C_2$ which is connected to the row having the selected memory device $M_{22}$, and "L" is applied to the other terminals $C_1$.... First selecting means $CS_2$ connected to the line having the selected memory device $M_{22}$ turn off the transistor $Q_{r2}$. First selecting means $CS_1$..., which are not connected to the line having the selected memory device $M_{22}$, turn on the transistors $Q_{r1}$..., respectively. Therefore, the memory gate line $MGL_2$ connected to the selected memory device $M_{22}$ floats and the other memory gate lines $MGL_1$... are impressed with the reference voltage $V_{ref}$ from the generation circuit 41.

"H" is applied only to the terminal $L_2$ which is connected to the column having the selected memory device $M_{22}$ and "L" is applied to the other terminals $L_1$.... Therefore, only the control gate protecting transistors $H_{12}$, $H_{22}$,... which are connected to the column having the selected memory device $M_{22}$ are turned on. Although the reference voltage $V_{ref}$ is applied only to the control gate lines $CGL_1$, $CGL_2 \ldots$, the reference voltage $V_{ref}$ is applied only to the control gates of the memory devices which are connected to the column having the selected memory device $M_{22}$. On the other hand, the other control gates M11, M21, float.

In such a status, the voltage to be recorded, "L" or "H", is applied to the terminal IN. This write voltage is applied to the memory gate ling $MGL_2$ having the selected memory device $M_{22}$ through the transistor $Q_{R2}$, which turns on when "H" is applied to the terminal W/R, and the transistor $Q_{M2}$, which turns on when "H" is applied to the terminal $C_2$. To the other memory gate lines $MGL_1 \ldots$ this write voltage is not applied, because the terminals $C_1 \ldots$ are "L" and the transistors $Q_{M1} \ldots$ are turned off.

In the selected memory device $M_{22}$, the reference voltage $V_{ref}$ is applied to the control gate and the write voltage ("H" or "L") is applied to the memory gate. Therefore, the ferroelectric layer of memory device $M_{22}$ is polarized according to the write voltage to be recorded. The write voltage is also applied to the memory gate of memory devices $M_{231} \ldots$ lying in the same row (the selected row) as the selected memory device $M_{22}$. In these memory devices $M_{21} \ldots$, the control gates float. Therefore the ferroelectric layers of these memory devices $M_{21} \ldots$ are not influenced by the writing voltage. The reference voltage $V_{ref}$ is also applied to the control gate of memory devices $M_{12}$ . . . lying in the same column (the selected column) as the selected memory device $M_{22} \ldots$. Because the reference voltage, and not the write voltage, is applied to the memory gate of devices $M_{12} \ldots$, the ferroelectric layers of these memory devices are not influenced by the writing voltage.

Because the control gates of the memory devices $M_{11}$ . . in the rows other than the selected row, and in the columns other than the selected column, float and the reference voltage is applied to the memory gate, these ferroelectric layers are not influenced by the writing voltage.

As described above, only the selected memory device can be written to selectively.

Figure 13:
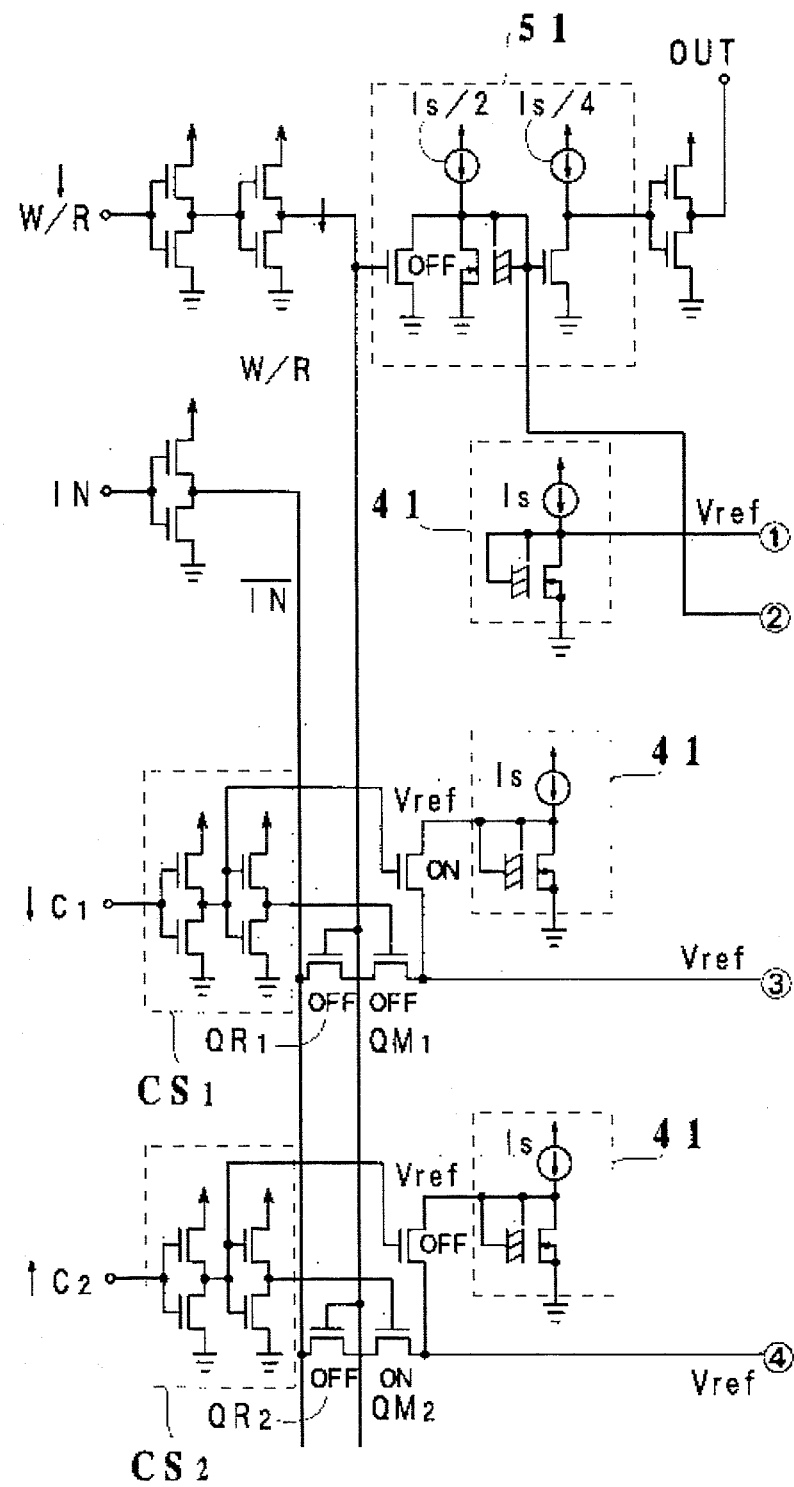
FIGS. 13 and 14 show the voltages applied to the nonvolatile memory in the read mode of the present invention.
Figure 14:
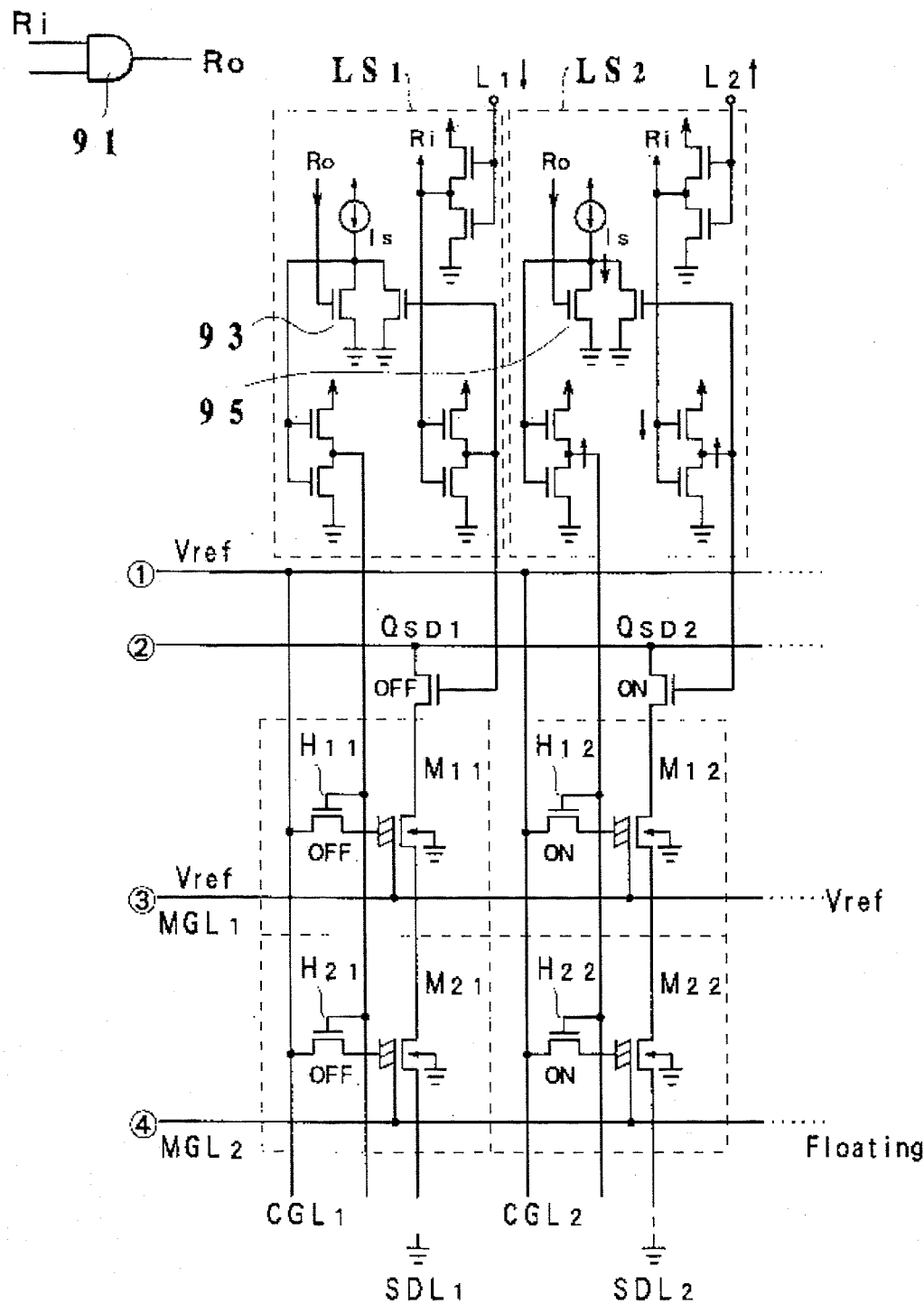

The voltage applied to each terminal in the read operation mode is shown in FIG. 13 and FIG. 14. Read operation of the selected memory device $M_{22}$ will be described below. In the read operation, "L" is applied to the terminal W/R, "L" is applied to a terminal $C_1$, "H" is applied to a terminal $C_2$, "L" is applied to a terminal $L_1$ and "H" is applied to a terminal $L_2$. The read-out voltage may be obtained at the OUT terminal.

Because the terminal W/R is "L", the input terminal 61 of the judgment circuit 51 is "L" and the judgment circuit 51 operates. In other words, the judgment circuit 51 judges the recorded information by judging the drain current and outputs the recorded information to the OUT terminal. Because the terminal W/R is "L", the transistors $Q_{R1}$, $Q_{R2}$ . . . turn off and the memory gate lines are not influenced by the voltage on the IN terminal.

As in the write operation, "H" is applied only to the terminal $C_2$ and the terminal $L_2$. Therefore, the memory gate line $MGL_2$ connected to the selected memory device $M_{22}$ floats and the reference voltage is applied to the other memory gate lines $MGL_1 \ldots$ from the generating circuit 41. Also, the reference voltage is the applied to the control gates of the memory device $M_{12}$, $M_{22} \ldots$; in the same column as the selected memory device $M_{22}$, and the other control gates of the memory devices $M_{11}$, $M_{21} \ldots$, float.

In the selected memory device $M_{22}$, the memory gate floats and the reference voltage is applied to the control gate. Therefore, a channel is formed (see point X in FIG. 7) when the ferroelectric layer of selected memory device $M_{22}$ is polarized in the second state and the channel is not formed (see point Y in FIG. 7) when the ferroelectric layer of selected memory device $M_{22}$ is polarized in the first state. In the memory devices $M_{12} \ldots$ connected together is series, the reference voltage is applied to both the control gate and the memory gate and the channel is formed corresponding to the current $I_S$ shown by point Z. Therefore, the state of the source-drain line is whether or not it has the capability of passing the current $I_S$.

Also, "H" is applied only to the terminal $L_2$ of the column having the memory device $M_{22}$ from which data has to be read out and "L" is applied to the other terminals $L_1 \ldots$.

So, only the transistor $Q_{SD2}$, the source-drain switching means, is turned on and the other transistors $Q_{SD1} \ldots$ are turned off. Therefore, only the source-drain line $SDL_2$, to which the selected memory device $M_{22}$ is connected, is connected to the judgment circuit 51. "H" or "L" output corresponding to the recorded data of the selected memory device $M_{22}$ may be obtained on the OUT terminal.

Figure 15:
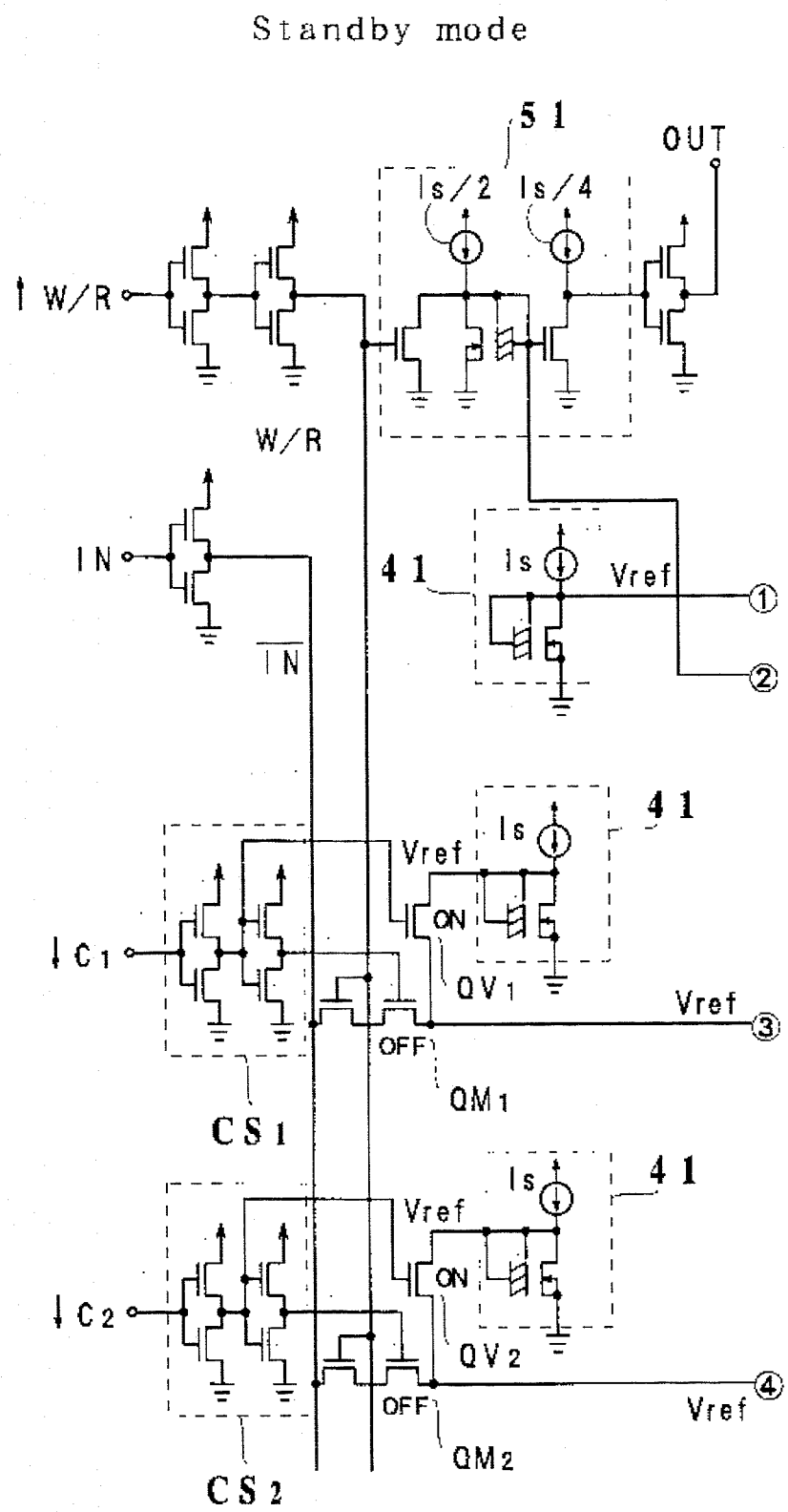
FIGS. 15 and 16 show the voltages applied to the nonvolatile memory in the standby mode of the present invention.
Figure 16:
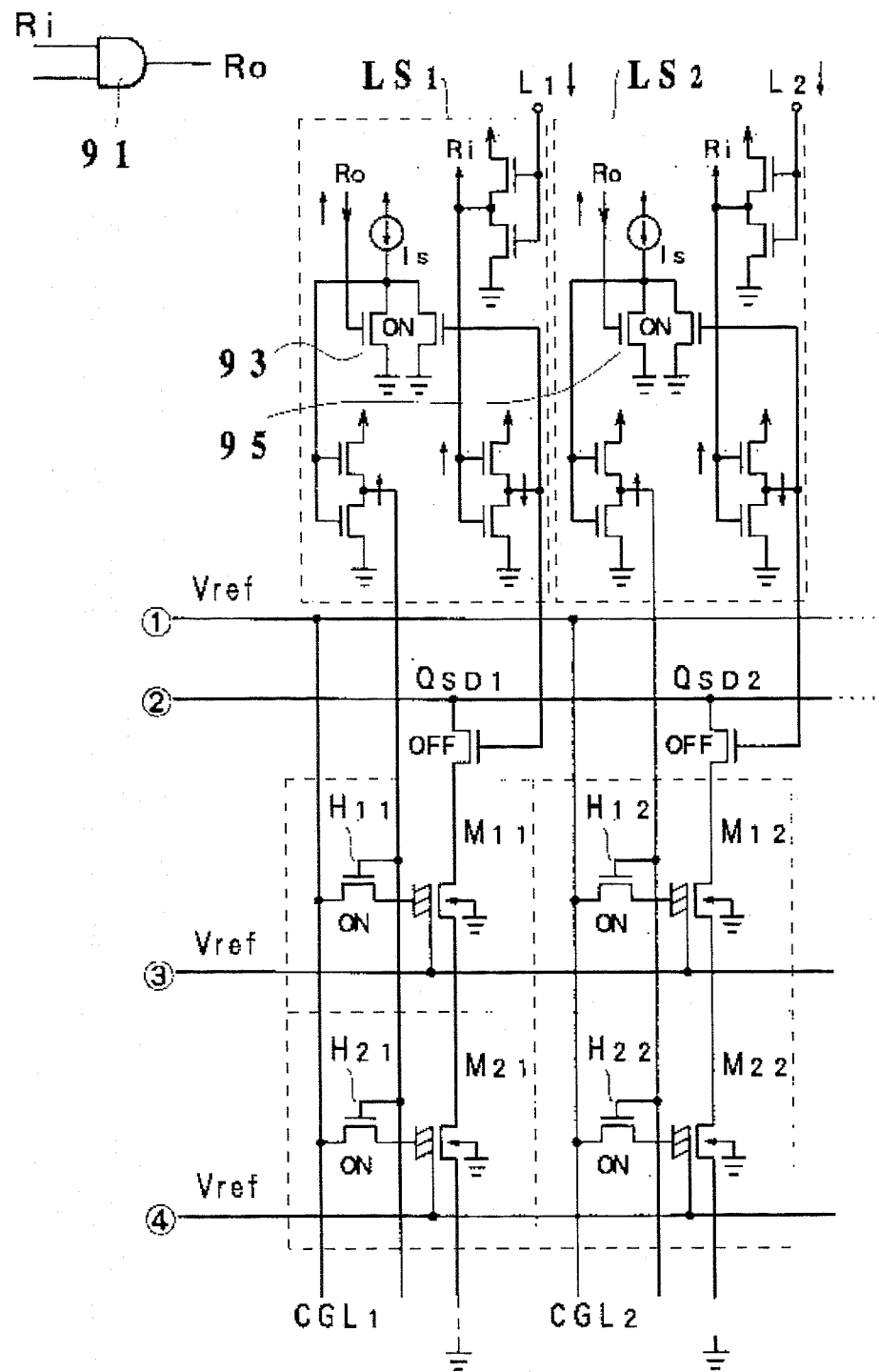

The standby mode will be described below in reference to FIG. 15 and FIG. 16. In standby mode, all terminals $C_1$, $C_2$ . . . , $L_1$, $L_2 \ldots$ are "L" (that is no address selection). By "L" being applied to terminals $C_1$, $C_2 \ldots$, the transistor $Q_{M1}$, $Q_{M2} \ldots$ are turned off and the reference voltage is applied to each memory gate of all the memory devices. Also, by being applied "L" to the terminals $L_1$, $L_2 \ldots$, each inverted output Ri of all the terminals $L_1$, $L_2 \ldots$ becomes "H". Because the inverted output Ri of all the terminals $L_1$, $L_2$ . . . is transmitted to the standby detection circuit 91 (AND circuit), the output $R_0$ of the standby detection circuit 91 becomes "H". By this "H" output, transistors 93 and 95 are turned on and all of the control gate protection transistors $H_{11}$, $H_{12} \ldots$, $H_{21}$, $H_{22} \ldots$ are turned on. Thus, the reference voltage is applied to each control gate of all the memory devices. Thus, changing written information can be prevented in the memory devices in the standby mode, because the reference voltage is applied to both the memory gates and the control gates of the memory devices.

Figure 18:
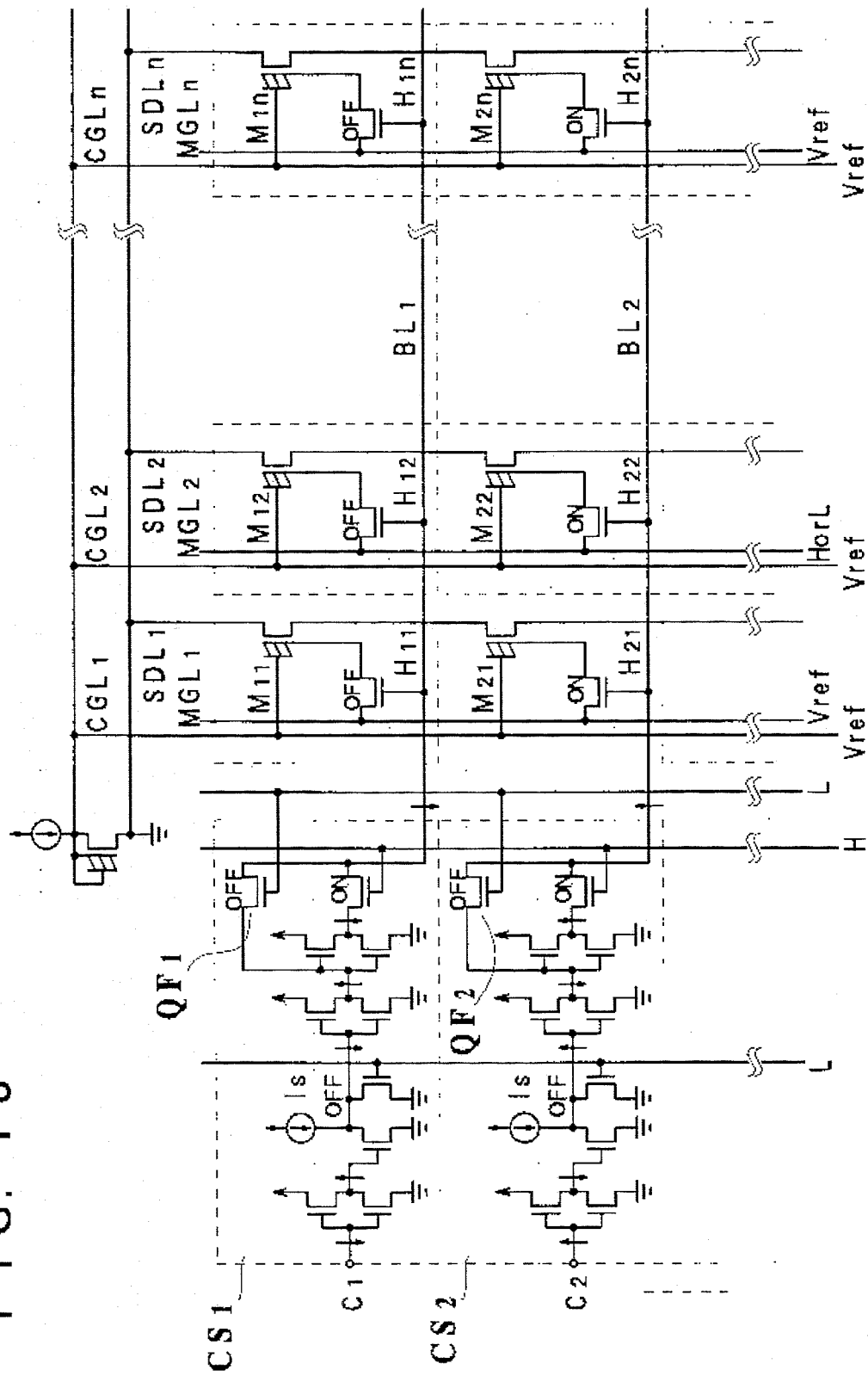
FIGS. 18 to 20 show the voltages applied in the write mode of a nonvolatile memory having a memory gate protection switching means.
Figure 19:
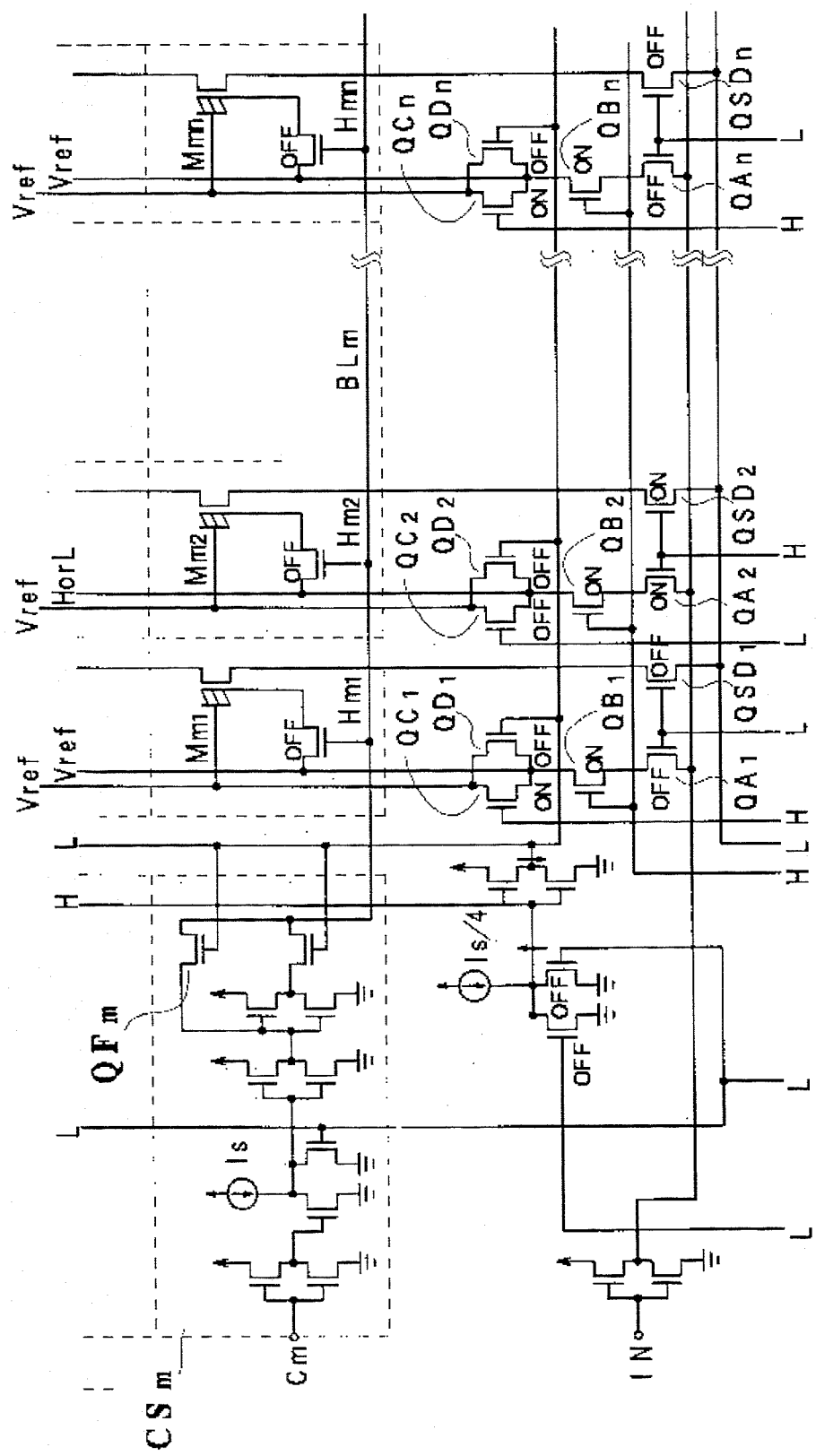
Figure 20:
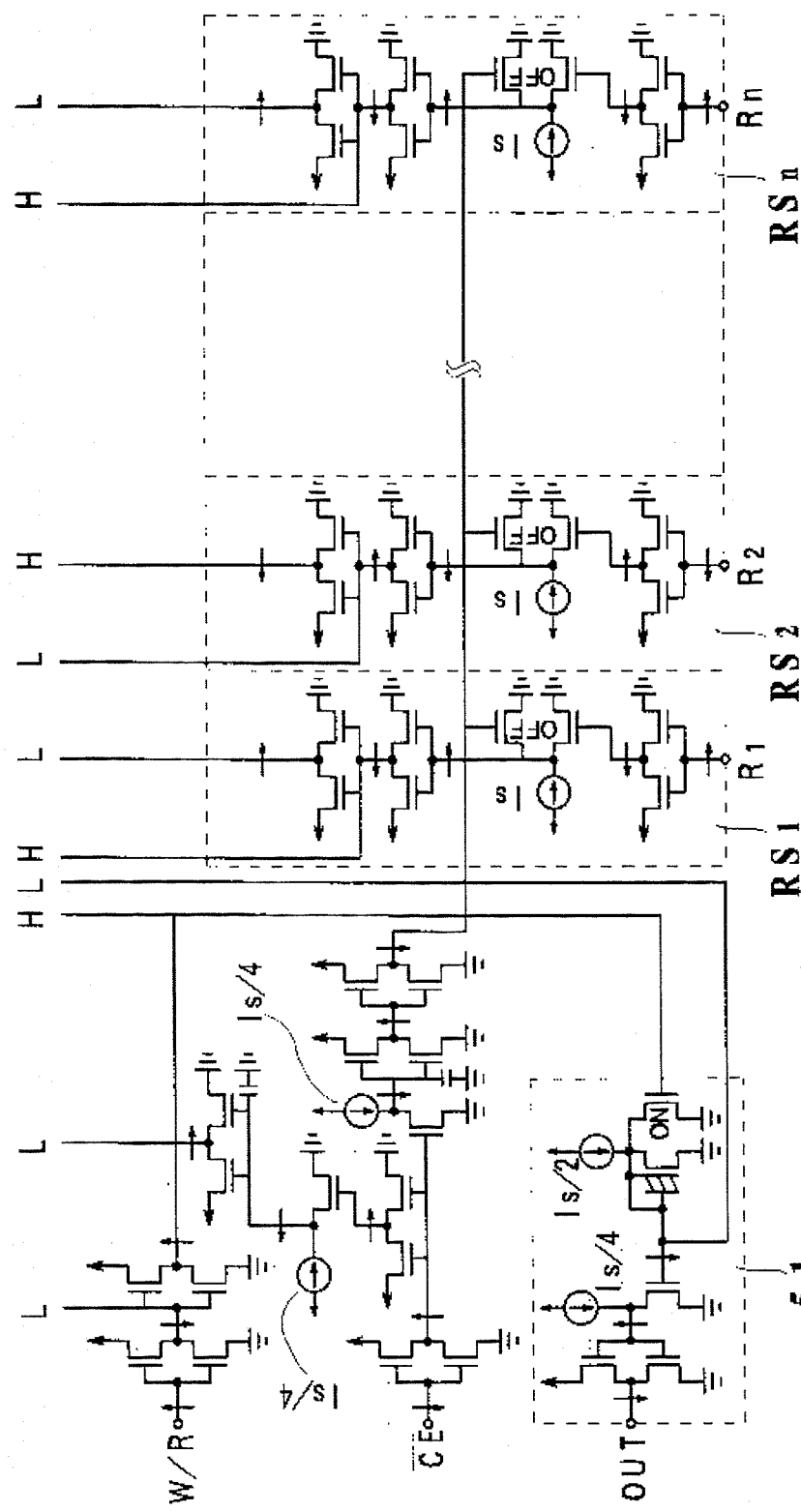

Nonvolatile memory matrix circuits of other embodiment of the present invention will be described in reference to FIGS. 18 to 26. FIGS. 18 to 20 show the write operation. In this embodiment, C1, C2 . . . Cm are terminals for row selecting input and CS1, CS2 . . . CSm are row selecting means. R1, R2 . . . Rm are terminals for column selecting input and Rs1, Rs2 . . . Rsm are column selecting means.

In this embodiment, as in the embodiment shown in FIGS. 11 to 16, each control gate of the memory devices lying in the same column is connected to a control gate line CGL1, CGL2 . . . CGLn, respectively. Also, each memory gate of memory devices lying in the same column is connected to a memory gate line MGL1, MGL2 . . . MGLn, respectively. Further, to select a row of the matrix, each memory gate of the memory devices is connected to a memory gate line through memory gate protection transistor H11 . . . Hmn respectively and each base electrode of the memory gate protection transistors (for example, H11, H12 . . . Hln) on the same row is connected to a base line (for example, BL1). Memory gate protection transistors connected to each base line BL1, BL2 . . . BLm are controlled by each line electing means CS1, CS2 . . . CSm, respectively.

Because the reference Voltage $V_{ref}$ is applied to all of the control gate lines CGL1, CGL2 . . . CGLn, the reference voltage $V_{ref}$ is always applied to each control gate of all the memory devices $M_{11} \ldots$ Mmn.

The voltage applied to each terminal in the write mode is shown in FIG. 27, and operating conditions for the write operation are shown in FIGS. 18 to 20. The write operation to the selected memory device $M_{22}$ will be described below. As shown in FIG. 27, for a write operation, "L" is applied to a terminal $\overline{CE}$(low active), "H" is applied to a terminal W/R, "L" or "H" to be recorded is applied to a terminal IN "H" is applied to a terminal $C_2$, "L" is applied to terminals C1, C3 . . . Cm, "H" is applied to a terminal R2 and "L" is applied to a terminal R1, R3 . . . Rn.

"H" is applied only to the terminal R2 of the column having the memory device $M_{22}$ to be written to and "L" is applied to the other terminals R1, R3 . . . Rn (see FIG. 20). Thus, transistors QC1, QC3 . . . QCn are turned on by the column selecting means RS1, RS3 . . . Rsn (see FIG. 19). Therefore, the reference voltage $V_{ref}$ is applied to the memory gate line MGL1, MGL3 . . . MGLn of the columns not having a memory device being written to. Also, transistors QA1, QA3 . . . QAn are turned off by the column selecting means RS1, RS3 . . . Rsn (see FIG. 19). Therefore, the voltage applied to the IN terminal is not applied to the memory gate lines MGL1, MGL3 . . . MGLn of the columns not having a memory device being written to. Further, transistor QA2 is turned on and transistor QC2 is turned off by the column selecting means RS2. Therefore, the voltage applied to the IN terminal is applied to the memory gate line MGL2 of the column having the memory device $M_{22}$ being written to.

On the other hand "H" is applied only to terminal C2 of the row having the memory device $M_{22}$ being written to, and "L" is applied to the other terminals C1, C3 . . . Cn. Thus "H" is applied only to the base line BL2 by the row selecting means CS2 of the row having memory device $M_{22}$ being written to. Therefore, only the memory gate protection transistors H21, H22, H23 . . . H2n on the line having the memory device $M_{22}$ being written to are turned on. Thus each memory gate of the memory device M21, $M_{22}$, M23 . . . M2n is connected to the memory gate line MGL1, MGL2, MGL3 . . . MGLn, respectively.

In the memory device $M_{22}$ which is being written to, the reference voltage is applied to the control gate and the voltage being written, "H" or "L", is applied to the memory gate. Thus, the ferroelectric layer of the memory device $M_{22}$ is polarized according to the write voltage applied to the IN terminal and the write operation is carried out.

In the write operation, the memory gate protection transistors H21, H23 . . . H2n of the memory device M21, M23 . . . M2n, except for the selected memory device $M_{22}$ itself, which lie on the same row as the memory device, $M_{22}$, are turned on. However, the memory devices M21, M23 . . . M2n are not written to because the reference voltage is applied to the memory gates lines MGL1, MGL3 . . . MGLn.

Also, memory gate protection transistors H12, H32 . . . Hm2 of the memory devices M12, M32 . . . Mm2, except for the selected memory devices $M_{22}$ itself, lying in the same column as the memory device $M_{22}$ are turned off. Thus the memory devices M12, M32, Mm2 are not written to because the memory gates of the memory devices M12, M32 . . . Mm2 do not have the voltage applied to the IN terminal applied to them.

Figure 21:
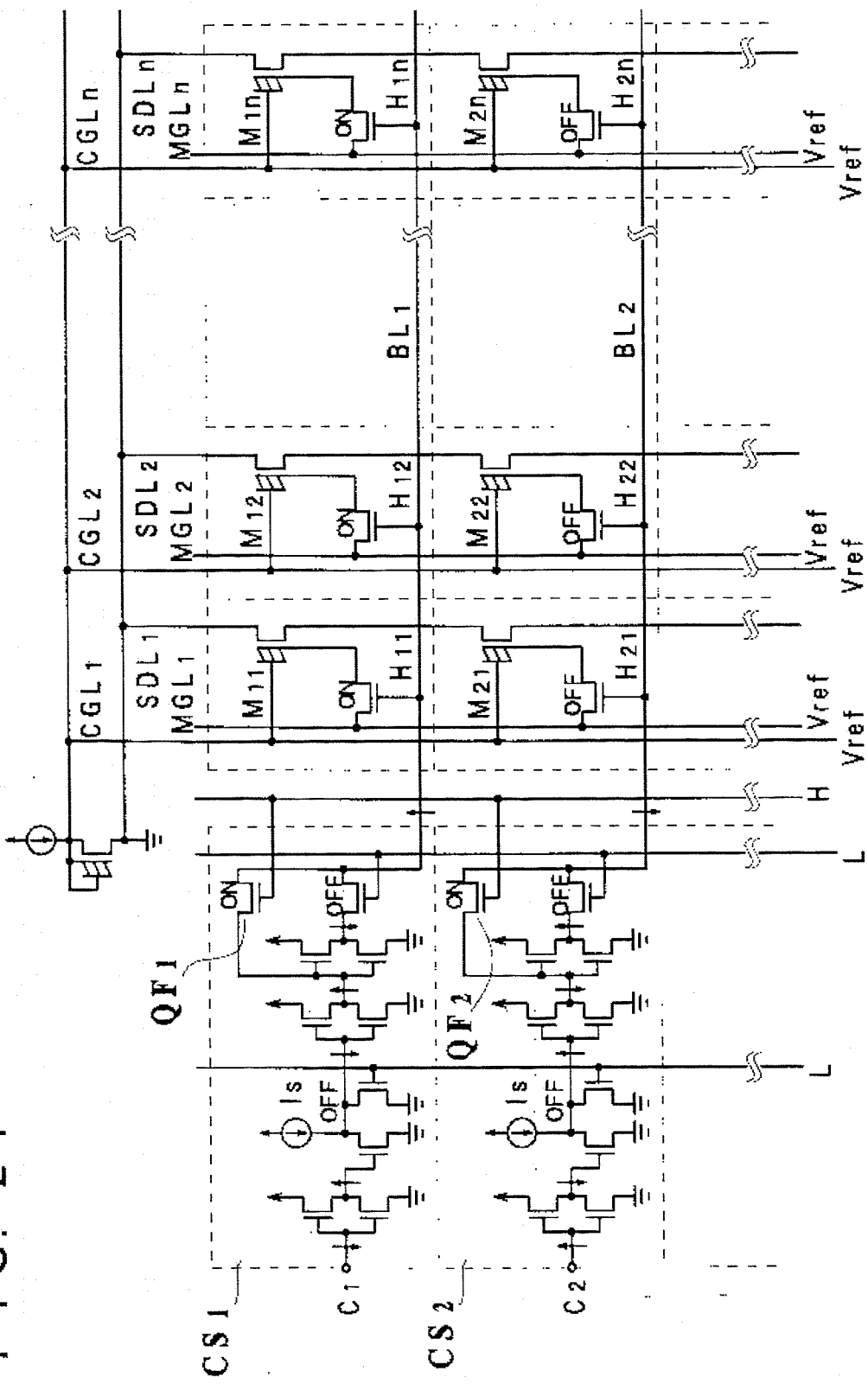
FIGS. 21 to 23 show the voltages applied in the read mode of a nonvolatile memory having a memory gate protection switching means.
Figure 22:
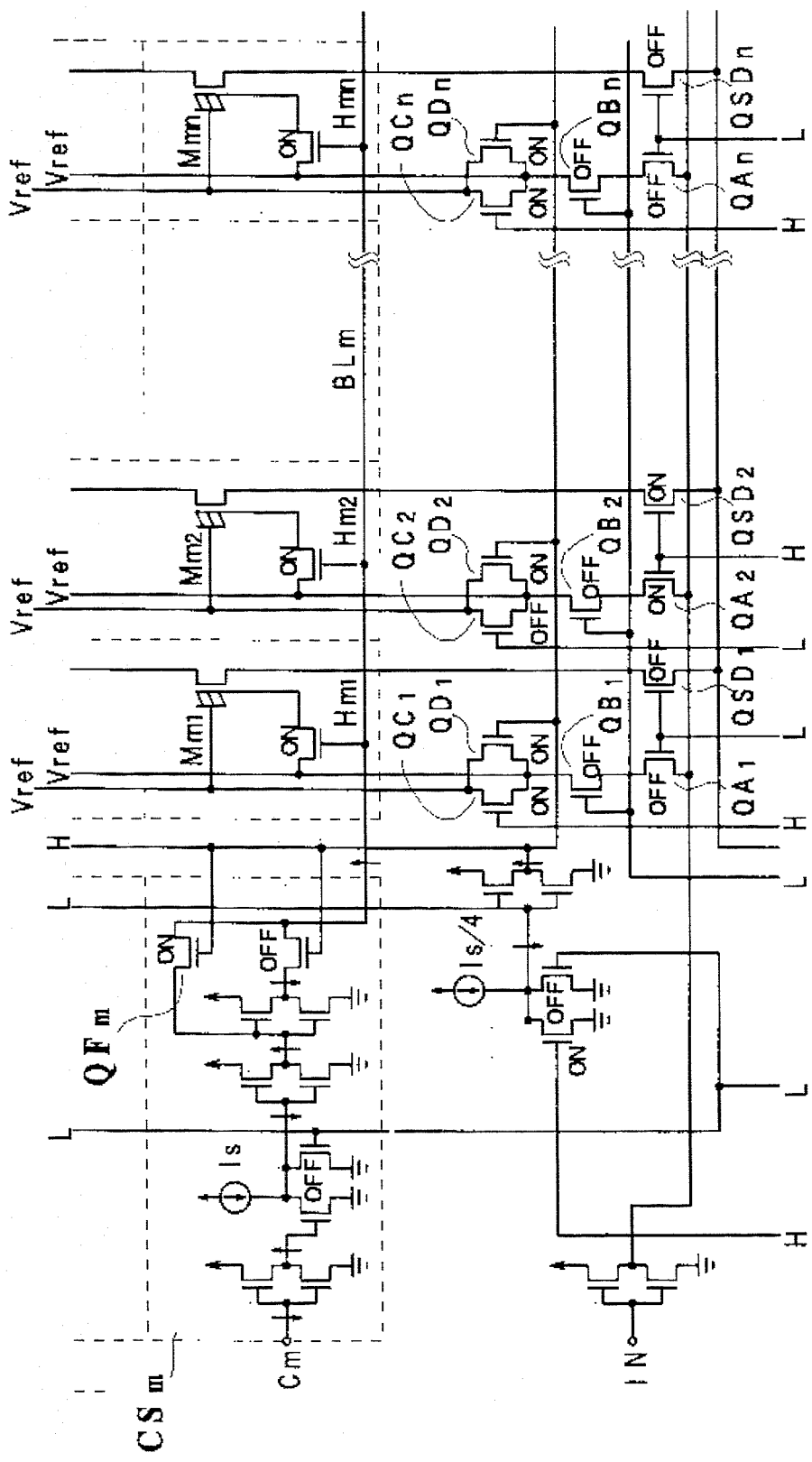
Figure 23:
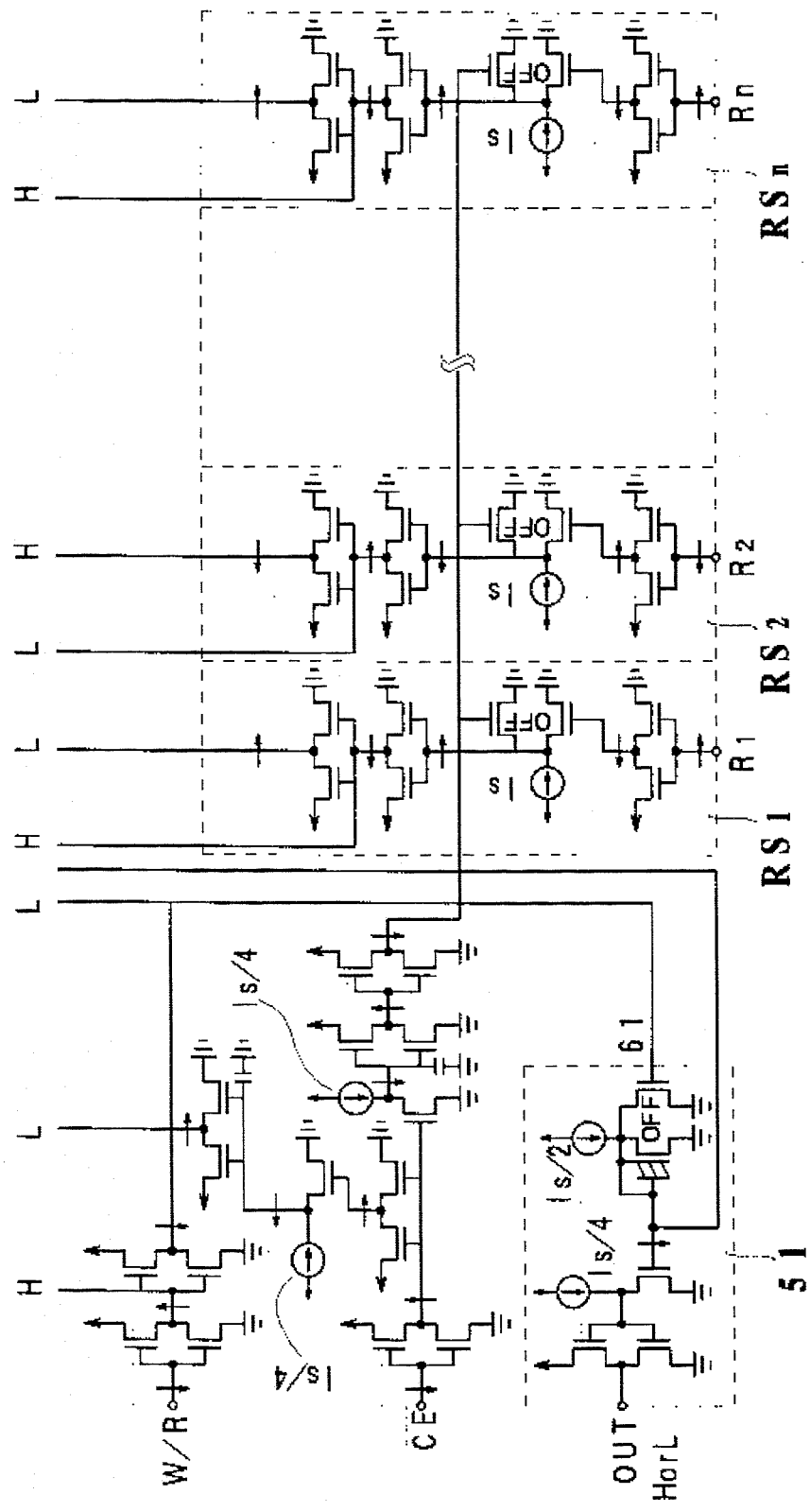

The voltage applied to each of the terminals in the read operation mode is shown in FIG. 27, and the operating conditions for the read operation are shown in FIGS. 21 to 23. The read operation to the selected memory device $M_{22}$ will be described below. As shown in FIG. 27 for the read operation, "L" is applied to a terminal $\overline{CE}$ "L" is applied to the terminal W/R, "H" is applied to a terminal $C_2$ "L" is applied to terminals C1, C3 . . . Cm, "H" is applied to a terminal R2 and "L" is applied to a terminal R1, R3 . . . Rn. The read-out may be obtained on the OUT terminal.

Because the terminal W/R is "L" in the read operation mode, the input terminal 61 of the judgment circuit for the drain current 51 is "L" (see FIG. 23) and the judgment circuit 51 operates. Because the terminal W/R is "L", the transistors QB1, QB2 . . . QBn are turned off, and the memory gate lines MGL1, MGL2 . . . MGLn are not influenced by the voltage on the IN terminal.

Further, Because "L" is applied to the terminal W/R, the transistors QF1, QF2 . . . QFn of the row selecting means CS1, CS2 . . . CSn are turned on (see FIGS. 21, 22), and "H" is applied to the base line BL1, BL3 . . . BLn except for the base line BL2. In other words, the inverse voltages are applied compared with the case of the write mode. Therefore, the memory gate protection transistors on the rows without the selected memory device $M_{22}$ are turned on. Because the memory gets protection transistors H21, H22 . . . H2n of the memory devices M21, $M_{22}$ . . . M2n on the same row as the selected memory device $M_{22}$ are turned off, the memory gates of the memory device M21, $M_{22}$ . . . M2n float.

On the other hand, the transistors QSD1, QSD3 . . . QSDn are turned off and only the transistor QSD2 is turned on by the column selecting means RS1, RS2 . . . Rsn (see FIG. 22). Therefore, only the source-drain line SDL2 having the selected memory device $M_{22}$ is connected to the judgment circuit for the drain current 51.

In the selected memory device $M_{22}$, the memory gate floats and the reference voltage is applied to the control gate. Therefore, a channel corresponding to the current shown by point X in FIG. 7 is formed when the ferroelectric layer of selected memory device $M_{22}$ is polarized in the second state, and a channel is not formed (see point Y in FIG. 7) when the ferroelectric layer of selected memory device $M_{22}$ is polarized in first state. In the memory device M12 . . . connected together in series, the reference voltage is applied to both the control gate and the memory gates and a channel is formed corresponding to the current $I_S$ shown by point Z. Therefore, the state of the source-drain line SDL2 depends on whether it has the capability of passing the current $I_S$ or not, corresponding to the recorded data in the memory device $M_{22}$.

As mentioned above, only the source-drain line SDL2, to which the selected memory device $M_{22}$ is connected, is connected to the judgment circuit 51. Thus, an "H" or "L" output, corresponding to the recorded data of the selected memory device $M_{22}$, can be obtained on the OUT terminal.

Figure 24:
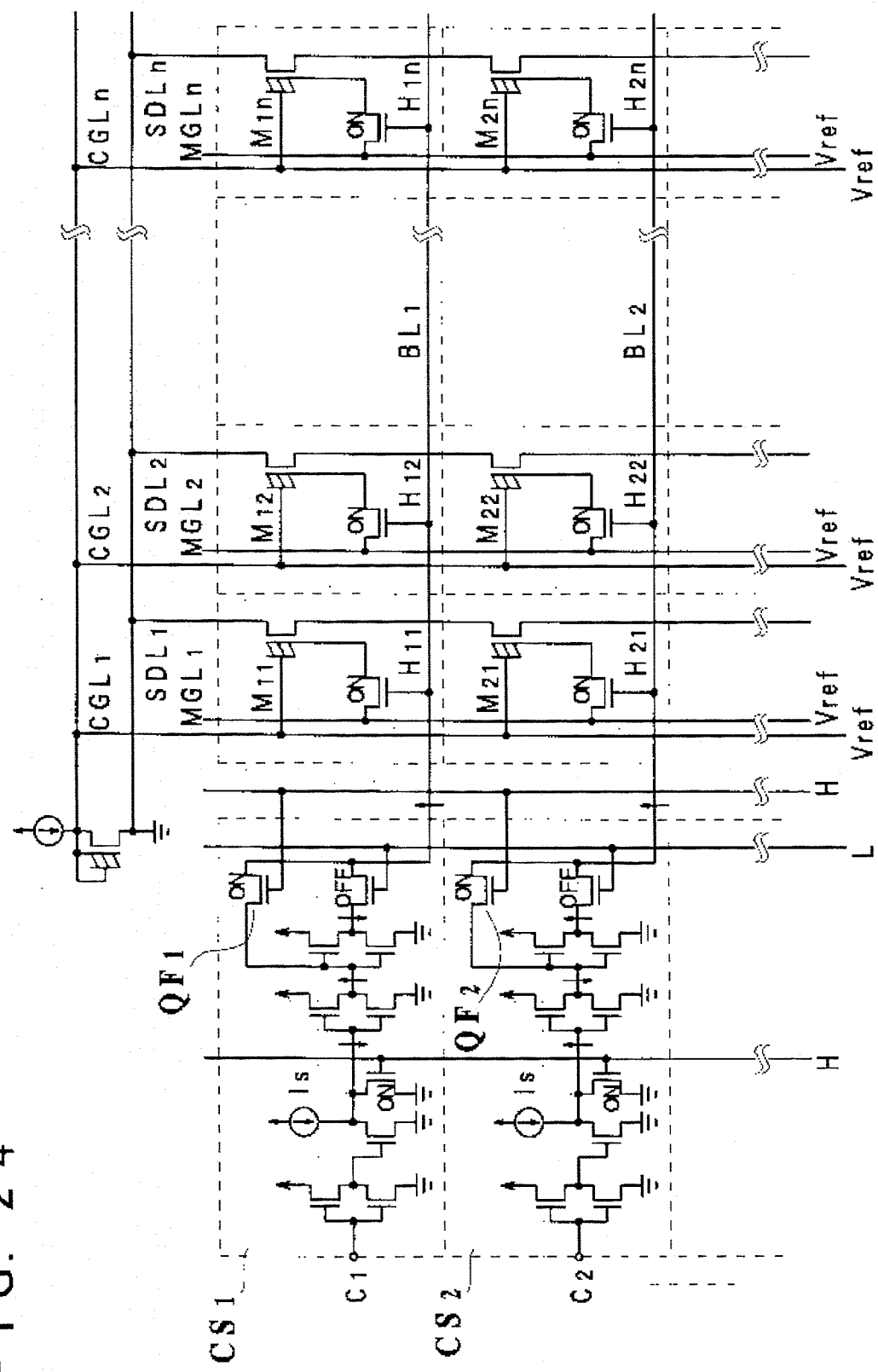
FIGS. 24 to 26 show the voltages applied in the standby mode of a nonvolatile memory having a memory gate protection switching means.
Figure 25:
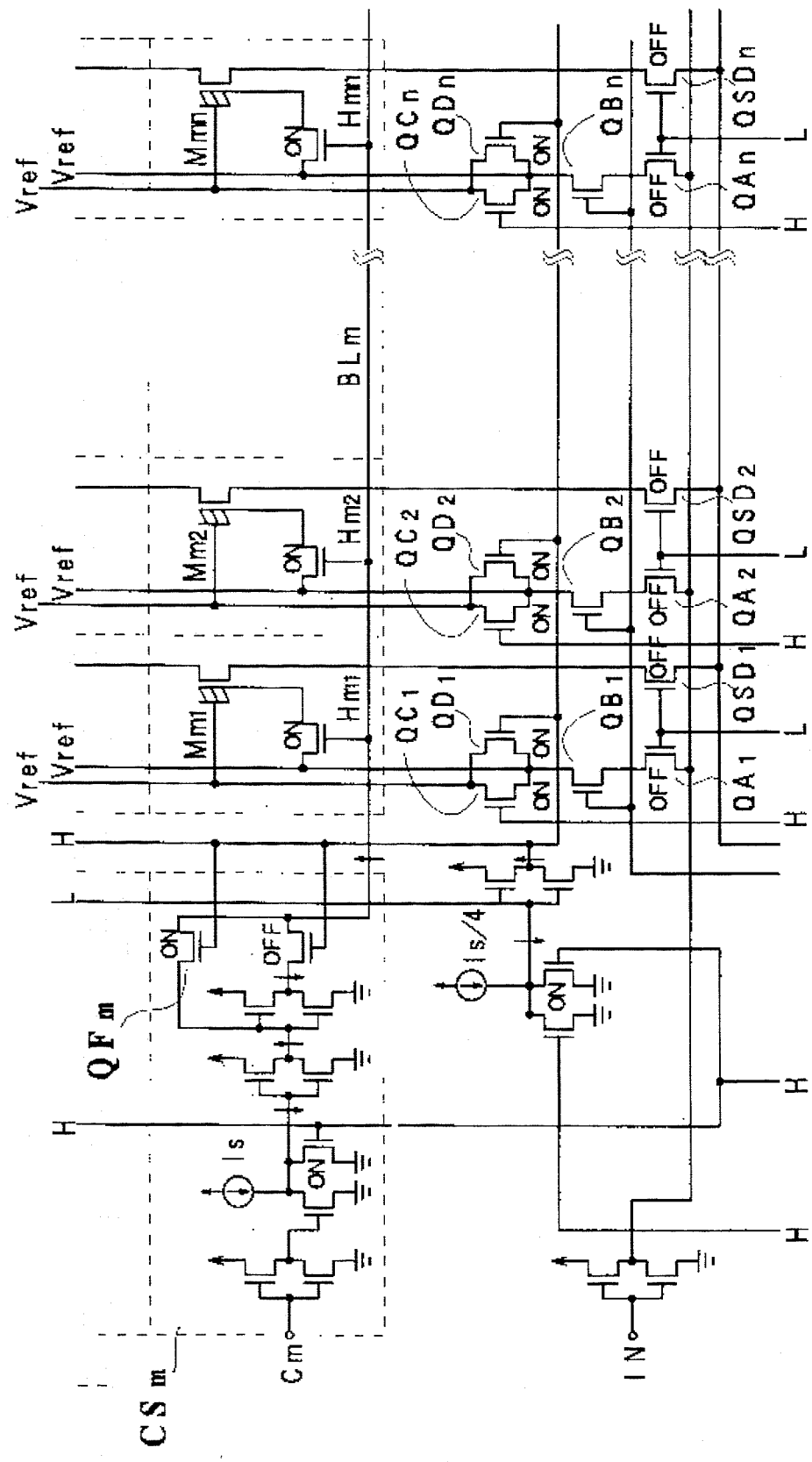
Figure 26:
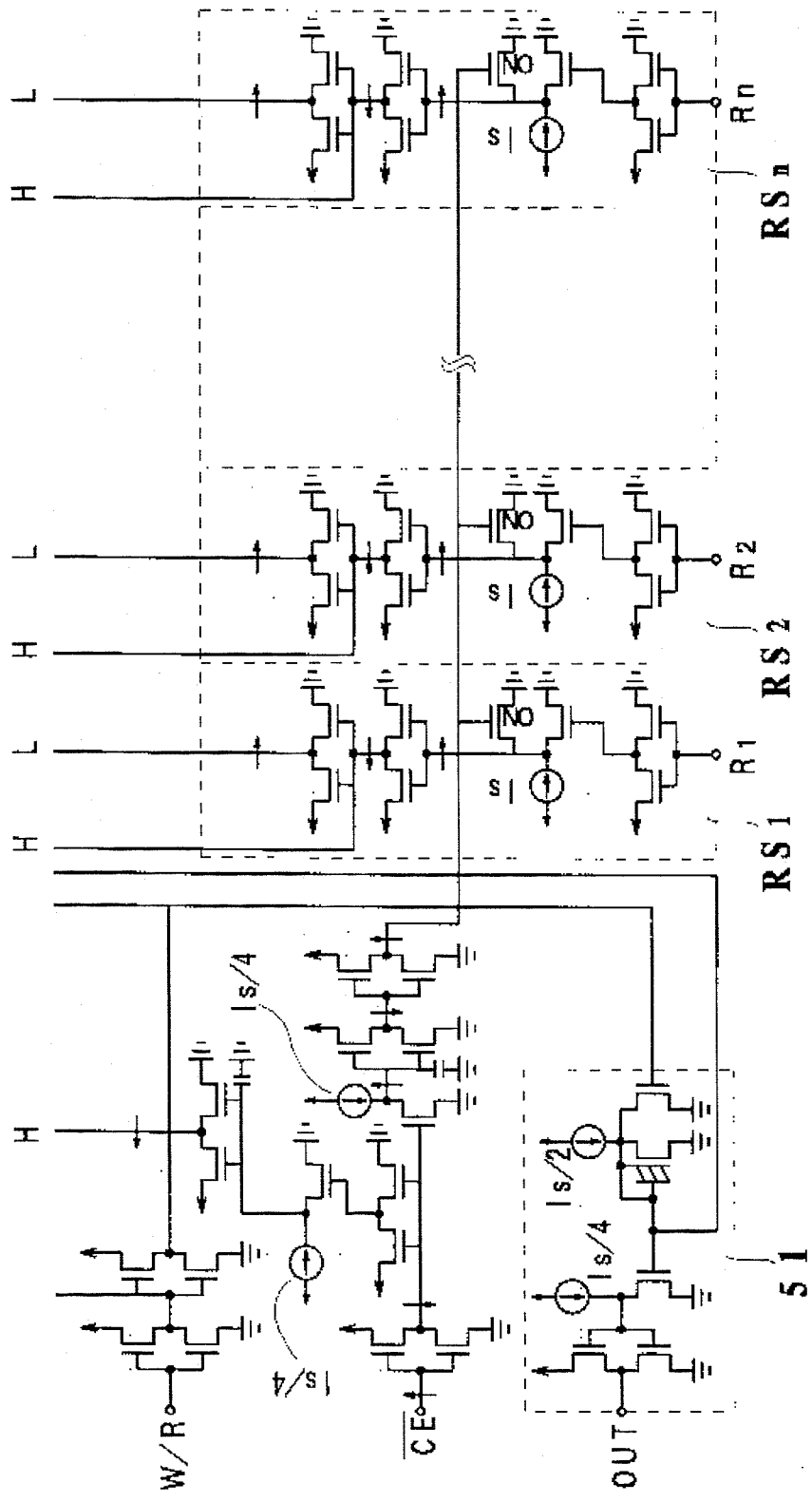

The voltage applied to each of the terminals in the standby mode is shown in FIG. 27, and the operating conditions for the standby mode are shown in FIGS. 24 to 26. As shown in FIG. 27 for the standby mode, "H" is applied to a terminal $\overline{CE}$. Thus, an output which is equivalent to the output obtained by applying "L" to all the terminals C1, C2 . . . Cm and R1, R2 . . . Rn is obtained from each selecting means CS1, CS2 . . . CSm, RS1, RS2 . . . RSn. Therefore, all the transistors QC1, QC2 . . . QCn are turned on, and all reference voltage is applied to control lines and memory gate lines CGL1, CGL2 . . . CGLn, and MGL1, MGL2 . . . MGLn. Also, because all the base lines BL1, BL2 . . . BLm are turned on, all the memory gate protection transistors H11, H12 . . . H1n, H21, H22 . . . H2n, . . . Hm1, Hm2 . . . Hmn are turned on, and the reference voltage is applied to the memory gates of all the memory devices. Because both the control gates and the memory gates of all the memory devices are applied with the reference voltage $V_{ref}$, changing the written information in the memory devices is thus prevented in the standby mode.

Although the protection transistor is inserted between the control gate and the control gate line in the embodiment shown in FIGS. 11 to 16, the protection transistor is inserted between the memory gate and the memory gate line in this embodiment shown in FIGS. 18 to 26. In the embodiment shown in FIGS. 11 to 16, the memory gates of the memory devices M21, $M_{22}$, M23 . . . M2n on the same row having the selected memory device $M_{22}$ are connected together through the memory gate line MGL2 which floats in the read operation mode. Therefore, any residual electric charge of the ferroelectric layer of the selected memory device $M_{22}$ controls the capacity containing the distributed capacity of the memory devices M21, M23 . . . M2n other than the selected memory device $M_{22}$. Thus, the operating load is heavy in the read operating mode. In contrast because the protection transistor is inserted between the memory gate and the memory gate line in this embodiment shown in FIGS. 18 to 26, memory gates of the memory devices are separated from each other, and operating load can be light in the read operating mode.

In the nonvolatile memory of the present invention, the control gate and the memory gate are provided at either side of the ferroelectric layer. Further, the control gates of devices in the same column are connected to the control gate line, and the memory gates of devices in the same row are connected to the memory gate line. Therefore, write or read operations to a desired device can be carried out by selectively applying a voltage to the control gate line and the memory gate line.

In the nonvolatile memory of the present invention, each source-drain line has a drain switching means and each memory gate line has a memory gate switching means. Therefore, write or read operations can be carried out by controlling these switching devices to select the desired device.

In the nonvolatile memory of the present invention, the control gates of devices lying in the same column are connected to the control gate line through the control gate protection switching means. An unwanted voltage is not applied to the unselected devices because the control gate protection switching means in the unselected columns is turned off. Therefore, erroneous writing to or reading of unselected devices can be prevented.

In the nonvolatile memory of the present invention, first selecting means is provided for each row and second selecting means is provided for each column. Therefore, the write or read operation to the desired device can be carried out by selectively applying the selected input to the first and second selecting means.

In the nonvolatile memory of the present invention, all the control gate switching means turn on and the reference voltage is applied to all the control gates when no selecting input is applied to any of the columns. Therefore, an unexpected voltage is not applied to either side of the ferroelectric layer and recorded information is not changed when neither a read operation nor a write operation is carried out.

In the writing method of the present invention, the writing voltage ("H" or "L") is impressed to the memory gate, and the reference voltage is impressed to the control gate, of only the selected device. Therefore, a writing operation can be carried out on the selected device without undesirably affecting unselected devices.

In the reading method of the present invention the reference voltage is applied to the control gate and the memory gate floats, only in the selected device. Therefore, writing to the selected device can be carried out without undesirably affecting unselected devices.

In the standby method of the present invention, the reference voltage is applied to all the memory gate lines and control gate lines. Therefore, recorded information is not changed in the standby mode.

In the nonvolatile memory of the present invention, the memory gates of devices in the same column are connected to the memory gate line through the memory gate protection switching means. An unwanted voltage is not applied to the unselected devices because the memory gate protection switching means in the unselected columns is turned off. Therefore, erroneous writing to or reading of unselected devices can be prevented.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A nonvolatile memory formed by nonvolatile memory devices connected in a matrix:

wherein the nonvolatile memory device comprises:

a source region of a first conductive type and a drain region of the first conductive type;

a channel region of a second conductive type formed between the source and the drain regions;

a memory gate formed as a conducting layer on the channel region and insulated from the channel region;

a ferroelectric layer formed on the memory gate; and a control gate formed on the ferroelectric layer as a conducting layer; and wherein the nonvolatile memory comprises, a source-drain line connecting the drain regions and the source regions of neighboring nonvolatile memory devices in a same column of the matrix and connecting the nonvolatile memory devices in the same column of the matrix in series, a control gate line connecting the control gates of the nonvolatile memory devices in the same column of the matrix, a memory gate line connecting the memory gates of the nonvolatile memory devices in a same row of the matrix.

2. The nonvolatile memory in accordance with claim 1 further comprising, drain switching means for switching between the source-drain line being connected and not connected to current judgment means for judging a drain current, the drain switching means being provided for each source-drain line; and memory gate switching means for switching between a writing voltage of level H or level L being applied to the memory gate line, the memory gate switching means being provided for each memory gate line.

3. The nonvolatile memory in accordance with claim 1 wherein;

the control gates of the nonvolatile memories in a same column of the matrix are connected to the control gate line through control gate protection switching means.

4. The nonvolatile memory in accordance with claim 3 wherein, read and write operations are carried out by applying a reference voltage to all of the control gate lines, and the control gate protection switching means in a column associated with a selected nonvolatile memory device are turned on and the other control gate protection switching means are turned off.

5. The nonvolatile memory in accordance with claim 3, further comprising:

first selecting means for using a first selecting input for of controlling the memory gate switching means to receive the first selecting input, the first selecting means being provided for each row of the matrix; and second selecting means for controlling the drain switch means and the control gate protection switching means to receive a second selecting input, the second selecting means being provided for each column of the matrix.

6. The nonvolatile memory in accordance with claim 3, wherein all of the control gate protection switching means are turned on when no second selecting input is applied to any column of the matrix, thereby the reference voltage being applied to the control gate lines.

7. A method of writing to the nonvolatile memory of claim 1, comprising the steps of:

applying a reference voltage to the control gate line connected to a selected nonvolatile memory device and allowing the other control gate lines to float;

applying a level H voltage, higher than the reference voltage, to the memory gate line connected to the selected nonvolatile memory device for polarizing the ferroelectric layer of the selected nonvolatile memory device to a first state or applying a level L voltage, lower than the reference voltage to the memory gate line connected to the selected nonvolatile memory device for polarizing the ferroelectric layer of the selected nonvolatile memory device to a second state; and applying the reference voltage to the other memory gate lines.

8. A method of reading from the nonvolatile memory of claim 1, comprising the steps of:

applying a reference voltage to the control gate line connected to a selected nonvolatile memory device and allowing the other control gate lines, to float, the reference voltage generating a first drain current when the ferroelectric layer the selected nonvolatile memory device is polarized with a first state, generating a second drain current when the ferroelectric layer of the selected nonvolatile memory device is polarized in a second state and generating a reference current, the reference current being intermediate the first drain current and the second drain current, when the ferroelectric layer of the selected nonvolatile memory device is not polarized;

allowing the memory gate line connected to the selected nonvolatile memory device to float and applying the reference voltage to the other memory gate lines; and judging whether a current of the source-drain line connected to the selected nonvolatile memory device is larger or smaller than about half a value of a reference current, thereby reading recorded information nondestructively.

9. A method of placing the nonvolatile memory of claim 1 in standby, comprising the step of:

applying a reference voltage to all of the control gate lines and all of the memory gate lines.

10. A nonvolatile memory formed by nonvolatile memory devices connected in matrix:

the nonvolatile memory device comprising a source region of a first conductive type and a drain region of the first conductive type;

a channel region of a second conductive type formed between the source and the drain regions;

a memory gate formed as a conductive layer on the channel region and insulated from the channel region;

a ferroelectric layer formed on the memory gate; and a control gate formed on the ferroelectric layer as a conductive layer;

wherein the nonvolatile memory comprises;

a source-drain line connecting the drain regions and the source regions of neighboring nonvolatile memory devices in a same column of the matrix and connecting the nonvolatile memory devices in the same column of the matrix in series, a control gate line connecting the control gates of the nonvolatile memory devices in the same column of the matrix, a memory gate line connecting the memory gates of the nonvolatile memory devices in the same column of the matrix.

11. A nonvolatile memory in accordance with claim 10 further comprising, drain switching means for switching the source-drain line between being connected and not connected to current judgment means for a drain current, the drain switching means being provided for each source-drain line; and memory gate switching means for switching between a writing voltage of level H or level L being applied to the memory gate line, the memory gate switching means being provided for each memory gate line.

12. The nonvolatile memory in accordance with claim 10 wherein, the memory gates of the nonvolatile memories in the same column of the matrix are connected to the memory gate line through memory gate protection switching means.

13. The nonvolatile memory in accordance with claim 12, wherein read operation is carried out by applying a reference voltage to all of the memory gate lines and turning off the memory gate protection switching means in a row of selected nonvolatile memory device and the other memory gate protection switching means are turned on, and a write operation is carried out by applying an H level voltage or L level voltage to the memory gate line connected to the selected nonvolatile memory device for writing and turning on the memory gate protection switching means in a row associated with the selected nonvolatile memory device and turning off the other memory gate protection switching means.

14. The nonvolatile memory in accordance with claim 12 further comprising, first selecting means for controlling the memory gate protection switching means by receiving a first selecting input, first selecting means being provided for each row of the matrix, and second selecting means for controlling the drain switching means and for using a second selecting input for controlling the memory gate switching means by receiving the second selecting input, the second selecting means being provided for each column of the matrix.

15. A writing method for the nonvolatile memory of claim 12, comprising the steps of:

applying a reference voltage to all of the control gate;

applying the reference voltage to the memory gate lines not connected to selected nonvolatile memory device;

turning on the memory gate protection switching means in a row including the selected nonvolatile memory device and; turning off the other memory gate protection switching means and applying a level H voltage: level H voltage being higher than the reference voltage, to the memory gate line connected to the selected nonvolatile memory device for polarizing the ferroelectric layer of the selected nonvolatile memory device to first state or applying a level L voltage, level L voltage being lower than the reference voltage, to the memory gate line connected to the selected nonvolatile memory device for polarizing the ferroelectric layer of the selected nonvolatile memory device to a second state.

16. A method of reading from the nonvolatile memory of claim 12, comprising the steps of:

applying a reference voltage to all of the control gate lines;

applying a reference voltage to all of the memory gate lines;

turning off the memory gate protection switching means in a row including a selected nonvolatile memory device; turning on the other memory gate protection switching means; and judging whether a current of the source-drain line connected to the selected nonvolatile memory device is larger or smaller than about half a value of a reference current, thereby recorded information nondestructively.

17. A method of placing the nonvolatile memory of claim 12 in standby, comprising:

applying a reference voltage to all of the control gate lines and to all of the memory gate lines; and turning on all of the memory gate protection switching means.

* * * * *